United States Patent
Kuki et al.

(10) Patent No.: US 12,543,309 B2
(45) Date of Patent: Feb. 3, 2026

(54) SEMICONDUCTOR STORAGE DEVICE AND METHOD OF MANUFACTURING SEMICONDUCTOR STORAGE DEVICE

(71) Applicant: Kioxia Corporation, Tokyo (JP)

(72) Inventors: Tomohiro Kuki, Yokkaichi (JP); Tatsufumi Hamada, Nagoya (JP); Shinichi Sotome, Yokohama (JP); Yosuke Mitsuno, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 771 days.

(21) Appl. No.: 17/654,684

(22) Filed: Mar. 14, 2022

(65) Prior Publication Data

US 2023/0093316 A1    Mar. 23, 2023

(30) Foreign Application Priority Data

Sep. 17, 2021  (JP) .................... 2021-152049

(51) Int. Cl.
*H10B 43/27* (2023.01)
*H10B 41/10* (2023.01)
*H10B 41/27* (2023.01)
*H10B 41/35* (2023.01)
*H10B 43/10* (2023.01)
*H10B 43/35* (2023.01)

(52) U.S. Cl.
CPC ............ *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/10; H10B 41/27; H10B 41/35; H10B 43/10; H10B 43/35
See application file for complete search history.

(56) References Cited

U.S. PATENT DOCUMENTS

| | | | |
|---|---|---|---|
| 8,334,561 B2 | 12/2012 | Fukuzumi et al. | |
| 8,581,329 B2 | 11/2013 | Ishiduki et al. | |
| 8,772,859 B2 | 7/2014 | Higuchi | |
| 9,245,962 B1* | 1/2016 | Yang | H10B 43/35 |
| 10,854,630 B2* | 12/2020 | Kim | H01L 29/7827 |
| 2011/0316064 A1 | 12/2011 | Kim et al. | |

(Continued)

FOREIGN PATENT DOCUMENTS

| CN | 111668226 A | 9/2020 |
|---|---|---|
| JP | 2010-199312 A | 9/2010 |

(Continued)

*Primary Examiner* — Ali Naraghi
*Assistant Examiner* — Da Wei Lee
(74) *Attorney, Agent, or Firm* — Oblon, McClelland, Maier & Neustadt, L.L.P.

(57) ABSTRACT

A semiconductor storage device according to an embodiment includes a stacked body and a pillar. The pillar includes an insulating core, a channel layer, and a memory film. A plurality of gate electrode layers included in the stacked body includes a plurality of first gate electrode layers and one or more second gate electrode layers. The channel layer includes a first portion and a second portion. The first portion is provided between an uppermost first gate electrode layer and the insulating core. The second portion extends from a first height to a second height. A film thickness of the second portion is greater than a film thickness of the first portion.

20 Claims, 14 Drawing Sheets

(56) References Cited

U.S. PATENT DOCUMENTS

| | | | |
|---|---|---|---|
| 2016/0064406 A1* | 3/2016 | Natori | H10D 99/00 |
| | | | 257/43 |
| 2017/0040379 A1 | 2/2017 | Sasago et al. | |
| 2018/0122959 A1* | 5/2018 | Calka | H10B 41/20 |
| 2019/0355744 A1* | 11/2019 | Kim | H10D 30/63 |
| 2019/0393242 A1 | 12/2019 | Kim | |
| 2020/0286902 A1 | 9/2020 | Fukuda et al. | |
| 2021/0296352 A1* | 9/2021 | Minemura | H10B 43/35 |

FOREIGN PATENT DOCUMENTS

| | | |
|---|---|---|
| JP | 2012-195424 A | 10/2012 |
| JP | 2013-55204 A | 3/2013 |
| TW | 202034507 A | 9/2020 |
| WO | WO 2015/097897 A1 | 7/2015 |

* cited by examiner

SEMICONDUCTOR STORAGE DEVICE AND METHOD OF MANUFACTURING SEMICONDUCTOR STORAGE DEVICE

CROSS-REFERENCE TO RELATED APPLICATION

This application is based upon and claims the benefit of priority from Japanese Patent Application No. 2021-152049, filed Sep. 17, 2021; the entire contents of which are incorporated herein by reference.

FIELD

Embodiments described herein relate generally to a semiconductor storage device, and a method of manufacturing a semiconductor storage device.

BACKGROUND

A NAND type flash memory including a memory cell three-dimensionally laminated therein is known.

DETAILED DESCRIPTION

Figure 1:
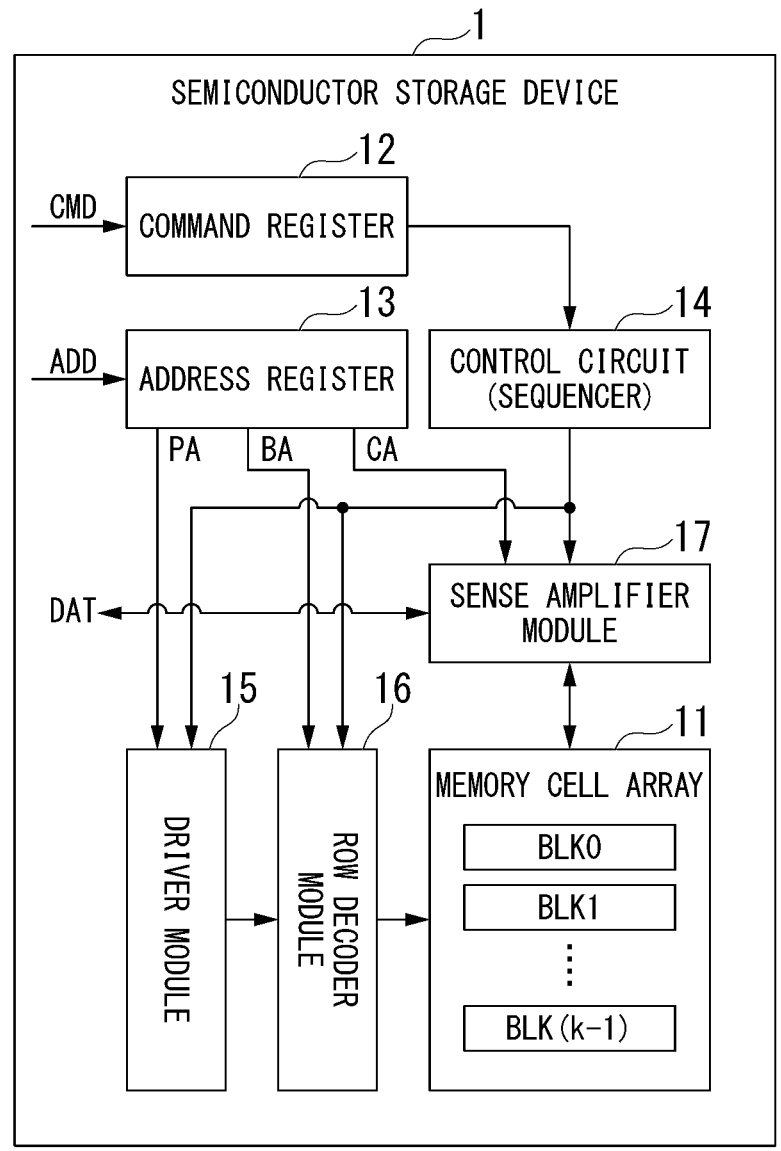
FIG. 1 is a block diagram showing a part of a configuration of a semiconductor storage device according to a first embodiment.

A semiconductor storage device according to an embodiment includes a stacked body, a pillar, and a bit line. The stacked body includes a plurality of gate electrode layers and a plurality of insulating layers. In the stacked body, the plurality of the gate electrode layers and the plurality of the insulating layers are alternately stacked in a first direction one layer by one layer. The pillar extends in the first direction in the stacked body. The pillar includes an insulating core, a channel layer, and a memory film. The channel layer is provided between the plurality of the gate electrode layers and the insulating core. The memory film is provided between the plurality of the gate electrode layers and the channel layer. The bit line is provided in one side in the first direction of the stacked body. The plurality of the gate electrode layers include a plurality of first gate electrode layers and one or more second gate electrode layers. A plurality of memory cell transistors are formed at intersection portions between the plurality of first gate electrode layers and the channel layer. The one or more second gate electrode layers are provided above the plurality of the first gate electrode layers when a side of the bit line is defined as above side. One or more selection transistors are formed at intersection portions between the one or more second gate electrode layers and the channel layer. The channel layer includes a first portion and a second portion. The first portion is arranged between an uppermost first gate electrode layer among the plurality of the first gate electrode layers and the insulating core. The second portion extends from a first height to a second height. The first height is above an upper end of an uppermost second gate electrode layer among the one or more second gate electrode layers. The second height is the same as a lower end of the uppermost second gate electrode layer or is lower than the lower end of the uppermost second gate electrode layer. A film thickness of the second portion in a second direction crossing the first direction is greater than a film thickness of the first portion in the second direction.

Hereinafter, a semiconductor storage device and a method of manufacturing a semiconductor storage device according to an embodiment will be described with reference to the drawings. In the following description, the same reference numerals are given to components having the same or similar function. Duplicate description of these components may be omitted. In the following description, in a case in which constituent members represented by a reference sign having number symbol or alphabetical letter at the end of the reference sign for distinction do not need to be distinct from each other, the number symbol or the alphabetical letter at the end of the reference sign may be omitted.

The terms "parallel", "perpendicular", and "the same as" may also include "substantially parallel", "substantially perpendicular", and "substantially the same as", respectively. The term "connection" is not limited to "mechanical connection" but may also include "electrical connection". That is, the term "connection" is not limited to a case in which a plurality of members are directly connected to each other but may also include a case in which a plurality of members are connected to each other via another member. The term "annular" is not limited to a circular form, but may also include a rectangular annular form, a triangular annular form, or the like. The term "adjacent" is not limited to a case in which a plurality of members are in contact with each other but may also include a case in which a plurality of members are spaced apart from each other (for example, in a case in which another member is interposed between a plurality of members).

First of all, an X direction, a Y direction, a Z direction, and an R direction will be defined in advance. The X direction and the Y direction are directions each of which is parallel to a surface of a silicon substrate 21 described below (refer to FIG. 3). The X direction is a direction in which a word line WL described below (refer to FIG. 3) extends. The Y direction is a direction crossing (for example, orthogonal to) the X direction. The Y direction is a direction in which a bit line BL described below (refer to FIG. 3) extends. The Z direction is a direction crossing (for example, orthogonal to) the X direction and the Y direction. The Z direction is a thickness direction of the silicon substrate 21. In the following description, in the Z direction, a direction from the silicon substrate 21 to a multi-layered body 30 described below may be referred to as "upper", and a direction opposite thereof may be referred to as "lower". In other words, the position at which a bit line BL is located with respect to a multi-layered body 30 may be referred to as "upper", and a direction opposite thereof may be referred to as "lower". However, the aforementioned expressions are for convenience but are not limited to a direction of gravitational force. The R direction is a radial direction of a pillar 40 described below (refer to FIG. 4). The R direction is a direction on a plane parallel to the X direction and the Y direction. The R direction is a direction crossing the Z direction (for example, a direction orthogonal to the Z direction). The Z direction is an example of "first direction". The R direction is an example of "second direction".

First Embodiment

<1. Configuration of Semiconductor Storage Device>

First of all, a configuration of a semiconductor storage device 1 according to the first embodiment will be described. In the explanation described below, an insulating part not associated with the explanation may be omitted in the drawings. In some of the drawings, hatching showing a cross section may be partially omitted in order to easily see the drawings.

FIG. 1 is a block diagram showing a configuration of the semiconductor storage device 1. The semiconductor storage device 1 is, for example, a nonvolatile semiconductor storage device, and a NAND type flash memory. The semiconductor storage device 1 is connectable to, for example, an external device (hereinbelow, referred to as "host device"). The semiconductor storage device 1 is used as a storage space of the host device. The semiconductor storage device 1 includes, for example, a memory cell array 11, a command register 12, an address register 13, a control circuit (sequencer) 14, a driver module 15, a row decoder module 16, and a sense amplifier module 17.

The memory cell array 11 includes a plurality of blocks BLK, block BLK0 to BLK (k−1) (k is an integer greater than or equal to one). The block BLK is a collective body of a plurality of memory cell transistors, each of which is configured to store data in a nonvolatile state. The block BLK is used as a data erase unit. A plurality of bit lines and a plurality of word lines are provided in the memory cell array 11. Each memory cell transistor is associated with one bit line and one word line.

The command register 12 holds a command CMD received from the host device by the semiconductor storage device 1. The command CMD includes a command that causes the control circuit 14 to execute, for example, a write operation, a readout operation, an erasure operation, or the like with respect to the memory cell array 11.

The address register 13 holds address information ADD received from the host device by the semiconductor storage device 1. The address information ADD includes, for example, a block address BA, a page address PA, and a column address CA. The block address BA, the page address PA, and the column address CA are used to select the block BLK, the word line, and the bit line, respectively.

The control circuit 14 is a circuit that controls operation of the semiconductor storage device 1. For example, in accordance with the command CMD held by the command register 12, the control circuit 14 controls the driver module 15, the row decoder module 16, and the sense amplifier module 17, or the like. The control circuit 14 executes the write operation, the readout operation, the erasure operation, or the like with respect to the memory cell array 11.

The driver module 15 includes a voltage generation circuit and generates a voltage used for the write operation, the readout operation, the erasure operation, or the like. The driver module 15 applies a generated voltage to a signal line corresponding to a selected word line, for example, in accordance with the page address PA held in the address register 13.

The row decoder module 16 selects one block BLK of the corresponding memory cell array 11 in accordance with the block address BA held in the address register 13. For example, the row decoder module 16 transfers the voltage applied to the signal line corresponding to the selected word line to the selected word line of the selected block BLK.

In the write operation, the sense amplifier module 17 applies a desired voltage to each bit line in accordance with write data DAT received from the host device by the semiconductor storage device 1. In the readout operation, the sense amplifier module 17 determines a data value stored in each memory cell in accordance with the voltage of the bit line and transfers the determination result to the host device as readout data DAT.

<2. Configuration of Memory Cell Array>
<2.1 Electrical Configuration of Memory Cell Array>

Next, an electrical configuration of the memory cell array 11 will be described.

Figure 2:
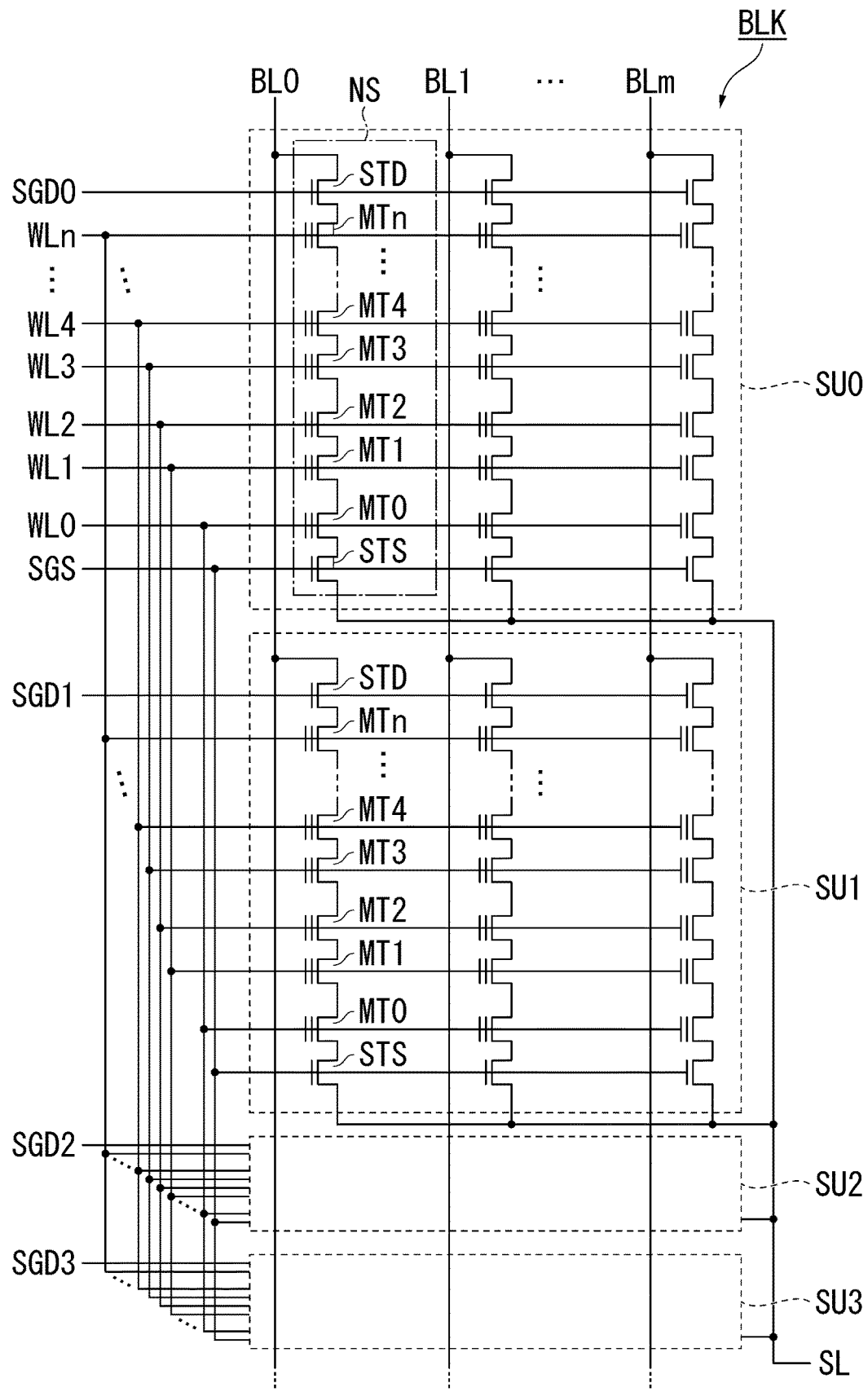
FIG. 2 is a view showing an equivalent circuit of a part of a memory cell array according to the first embodiment.

FIG. 2 is a view showing an equivalent circuit of a part of the memory cell array 11. FIG. 2 shows one block BLK included in the memory cell array 11. The block BLK includes a plurality of string units SU0 to SU3 (for example, four).

Each string unit SU includes a plurality of NAND strings NS associated with the bit lines BL0 to BLm (m is an integer greater than or equal to one) in one-to-one correspondence. Each NAND string NS includes, for example, a plurality of memory cell transistors MT0 to MTn (n is an integer greater than or equal to one), one or more drain-side select transistors STD, and one or more source-side select transistors STS.

The memory cell transistors MT0 to MTn are connected in series in each NAND string NS. Each memory cell transistor MT includes a control gate and a charge storage part. The control gate of the memory cell transistor MT is connected to any one of word lines WL0 to WLn. Each memory cell transistor MT causes the charge storage part to accumulate an electric charge in accordance with the voltage applied to the control gate via the word line WL and holds data in a nonvolatile state.

A drain of the drain-side select transistor STD is connected to the bit line BL corresponding to the NAND string NS. A source of the drain-side select transistor STD is connected to one end of the memory cell transistors MT0 to MTn connected in series. The control gate of the drain-side select transistor STD is connected to any one of drain-side select gate lines SGD0 to SGD3. The drain-side select transistor STD is electrically connected to a row decoder 11 via the drain-side select gate line SGD. The drain-side select transistor STD connects the NAND string NS and the bit line BL when a predetermined voltage is applied to the corresponding drain-side select gate line SGD.

A drain of the source-side select transistor STS is connected to the other end of the memory cell transistors MT0 to MTn connected in series. A source of the source-side select transistor STS is connected to a source line SL. The control gate of the source-side select transistor STS is connected to a source-side select gate line SGS. The source-side select transistor STS is electrically connected to the row decoder 11 via the source-side select gate line SGS. The source-side select transistor STS connects the NAND string NS and the source line SL when a predetermined voltage is applied to the source-side select gate line SGS.

In the same block BLK, the control gates of the memory cell transistors MT0 to MTn are mutually connected to the corresponding word lines WL0 to WLn, respectively. The control gates of the drain-side select transistors STD inside the string units SU0 to SU3 are mutually connected to the corresponding select gate lines SGD0 to SGD3, respectively. The control gate of the source-side select transistor STS is mutually connected to the select gate line SGS. In the memory cell array 11, the bit line BL is common to the NAND strings NS to which the same column address is assigned for each string unit SU.

<2.2 Physical Configuration of Memory Cell Array>

Next, a physical configuration of the memory cell array 11 will be described.

Figure 3:
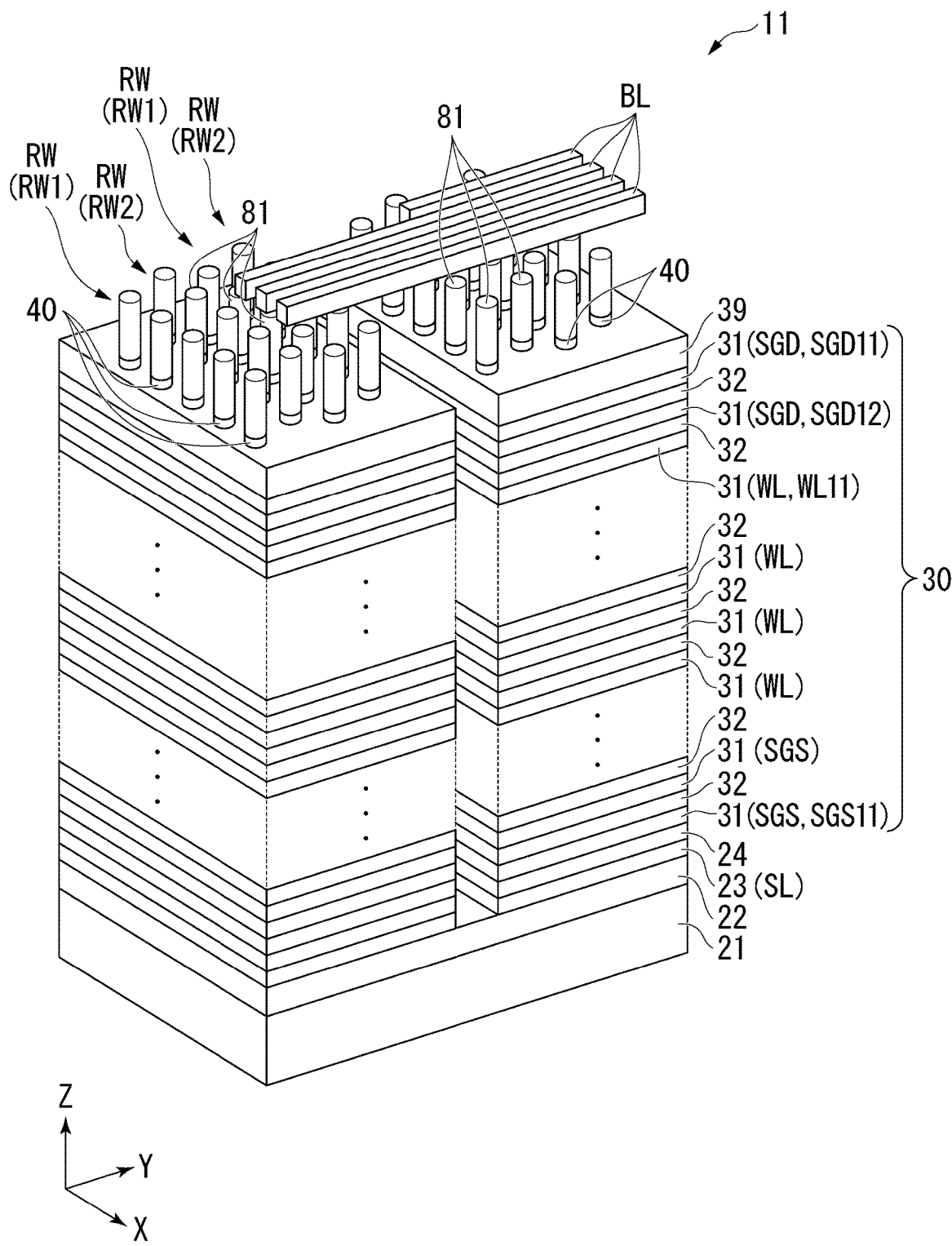
FIG. 3 is a perspective cross-sectional view showing a part of the memory cell array according to the first embodiment.

FIG. 3 is a perspective cross-sectional view showing a part of the memory cell array 11. The memory cell array 11 includes, for example, a silicon substrate 21, a semiconductor layer 22, a conductive layer 23, an insulating layer 24, a multi-layered body 30, a plurality of pillars 40, a plurality of contacts 81, and the plurality of the bit lines BL.

<2.2.1 Lower Structure>

The silicon substrate 21 is a substrate serving as a base of the semiconductor storage device 1. At least a part of the silicon substrate 21 is formed in a plate shape parallel to the X direction and the Y direction. The silicon substrate 21 is formed of a semiconductor material including, for example, silicon. The silicon substrate 21 is an example of "substrate".

The semiconductor layer 22 is provided on the silicon substrate 21. The semiconductor layer 22 is formed in a layer shape parallel to the X direction and the Y direction. The semiconductor layer 22 is a stopper layer that suppresses deep etching of a memory hole MH (refer to FIG. 6) in a manufacturing process of the semiconductor storage device 1. The semiconductor layer 22 is formed of a semiconductor material such as polysilicon. The semiconductor storage device 1 may include an insulating layer that functions as a stopper layer instead of the semiconductor layer 22.

The conductive layer 23 is provided on the semiconductor layer 22. The conductive layer 23 is formed in a layer shape parallel to the X direction and the Y direction. The conductive layer 23 is formed of a conductive material such as tungsten. A lower end portion of the pillar 40 is connected to the conductive layer 23. The conductive layer 23 functions as the source line SL.

The insulating layer 24 is provided on the conductive layer 23. The insulating layer 24 is formed in a layer shape parallel to the X direction and the Y direction. The insulating layer 24 is formed of an insulation material such as silicon oxide.

<2.2.2 Multi-Layered Body>

Next, the multi-layered body 30 will be described. The multi-layered body 30 is provided on the insulating layer 24. The multi-layered body 30 includes, for example, a plurality of conductive layers 31 and a plurality of insulating layers 32. The multi-layered body 30 is an example of "stacked body". The plurality of the conductive layers 31 and the plurality of the insulating layers 32 are stacked in layers one by one alternately in the Z direction. In other words, one conductive layer 31 is sandwiched between two insulating layers 32 adjacent to each other in the Z direction, and one insulating layer 32 is sandwiched between two conductive layers 31 adjacent to each other in the Z direction.

Each of the conductive layers 31 is formed in a plate shape parallel to the X direction and the Y direction. Each of the conductive layers 31 includes, for example, a body part and a barrier film. The body part is formed of a conductive material such as tungsten. The barrier film is provided on a surface of the body part. The barrier film is, for example, a titanium nitride film or a layered structure film formed of titanium nitride and titanium. The conductive layer 31 is an example of "gate electrode layer".

Of the plurality of the conductive layers 31, one or more (for example, a plurality of) conductive layers 31 furthest from the silicon substrate 21 function as the drain-side select gate lines SGD. In the embodiment, of the plurality of the conductive layers 31, each of the two conductive layers 31 furthest from the silicon substrate 21 functions as the drain-side select gate lines SGD. The drain-side select gate lines SGD are provided so as to be common to the plurality of the pillars 40 that align in the X direction or the Y direction. A different-level crossing portion between the drain-side select gate line SGD and a channel layer 42 functions as the aforementioned drain-side select transistor STD (refer to FIG. 2). Hereinbelow, for convenience of explanation, of the plurality (for example, two) of drain-side select gate lines SGD, the drain-side select gate line SGD furthest from the silicon substrate 21 (uppermost drain-side select gate line SGD) is referred to as "first drain-side select gate line SGD11". Similarly, of the plurality (for example, two) of drain-side select gate lines SGD, the drain-side select gate line SGD that is next to the first drain-side select gate line SGD11 via the insulating layer 32 and is closer to the silicon substrate 21 than the first drain-side select gate line SGD11 is referred to as "second drain-side select gate line SGD12". In other words, a distance from the silicon substrate 21 to the first drain-side select gate line SGD11 is longer than a distance from the silicon substrate 21 to the second drain-side select gate line SGD12 in the Z direction. The drain-side select gate line SGD is an example of each of "second conductive layer" and "second gate electrode layer". The first drain-side select gate line SGD11 is an example of each of "first layer" and "uppermost second gate electrode layer". The second drain-side select gate line SGD12 is an example of "second layer".

Of the plurality of the conductive layers 31, one or more (for example, a plurality of) conductive layers 31 that are closest to the silicon substrate 21 function as the source-side select gate line SGS. In the embodiment, of the plurality of the conductive layers 31, each of the two conductive layers 31 that are closest to the silicon substrate 21 functions as the source-side select gate line SGS. The source-side select gate lines SGS are provided so as to be common to the plurality of the pillars 40 that align in the X direction or the Y direction. A different-level crossing portion between the source-side select gate line SGS and the channel layer 42 functions as the aforementioned source-side select transistor STS (refer to FIG. 2).

Of the plurality of the conductive layers 31, each of the remaining conductive layers 31 sandwiched between the conductive layers 31 serving as the drain-side select gate line SGD or the source-side select gate line SGS functions as the word line WL. In the embodiment, a different-level crossing portion between the word line WL and the channel layer 42 functions as the memory cell transistor MT (refer to FIG. 2). The memory cell transistor MT will be particularly described below. The word lines WL are provided so as to be common to the plurality of the pillars 40 that align in the X direction and the Y direction. The word line WL is an example of each of "first conductive layer" and "first gate electrode layer". Hereinbelow, for convenience of explanation, of the plurality of the word lines WL, the word line WL (uppermost word line WL) furthest from the silicon substrate 21 is referred to as "word line WL11". The word line WL11 is an example of "uppermost first gate electrode layer".

The insulating layer 32 is provided between the two conductive layers 31 adjacent to each other in the Z direction. The insulating layer 32 is an interlayer insulating film that insulates the two conductive layers 31 from each other. The insulating layer 32 is formed in a plate shape parallel to the X direction and the Y direction. The insulating layer 32 is formed of an insulation material such as silicon oxide.

The multi-layered body 30 further includes an insulating layer 39. The insulating layer 39 is provided on the conductive layer 31 located at the uppermost position (the conductive layer 31 furthest from the silicon substrate 21). The insulating layer 39 is formed in a plate shape parallel to the X direction and the Y direction. The insulating layer 39 is formed of an insulation material such as silicon oxide.

<2.2.3 Pillar>

Next, the pillar 40 will be described.

The plurality of the pillars 40 are arranged on a surface parallel to the X direction and the Y direction. The plurality of the pillars 40 are spaced apart from each other at a distance. The plurality of the pillars 40 separately align in a plurality of rows RW. The rows RW are, for example, located at positions different from each other in the Y direction. Each of the rows RW extends in the X direction. The plurality of the pillars 40 included in an even-numbered row RW2 counted from an end row of the plurality of the rows RW in the Y direction are arranged so as to be displaced in the X direction from the plurality of the pillars 40 included in an odd-numbered row RW1 counted from the end row of the plurality of the rows RW in the Y direction. Each of the pillars 40 extends in the Z direction inside the multi-layered body 30. The pillar 40 may be referred to as "memory pillar".

Figure 4:
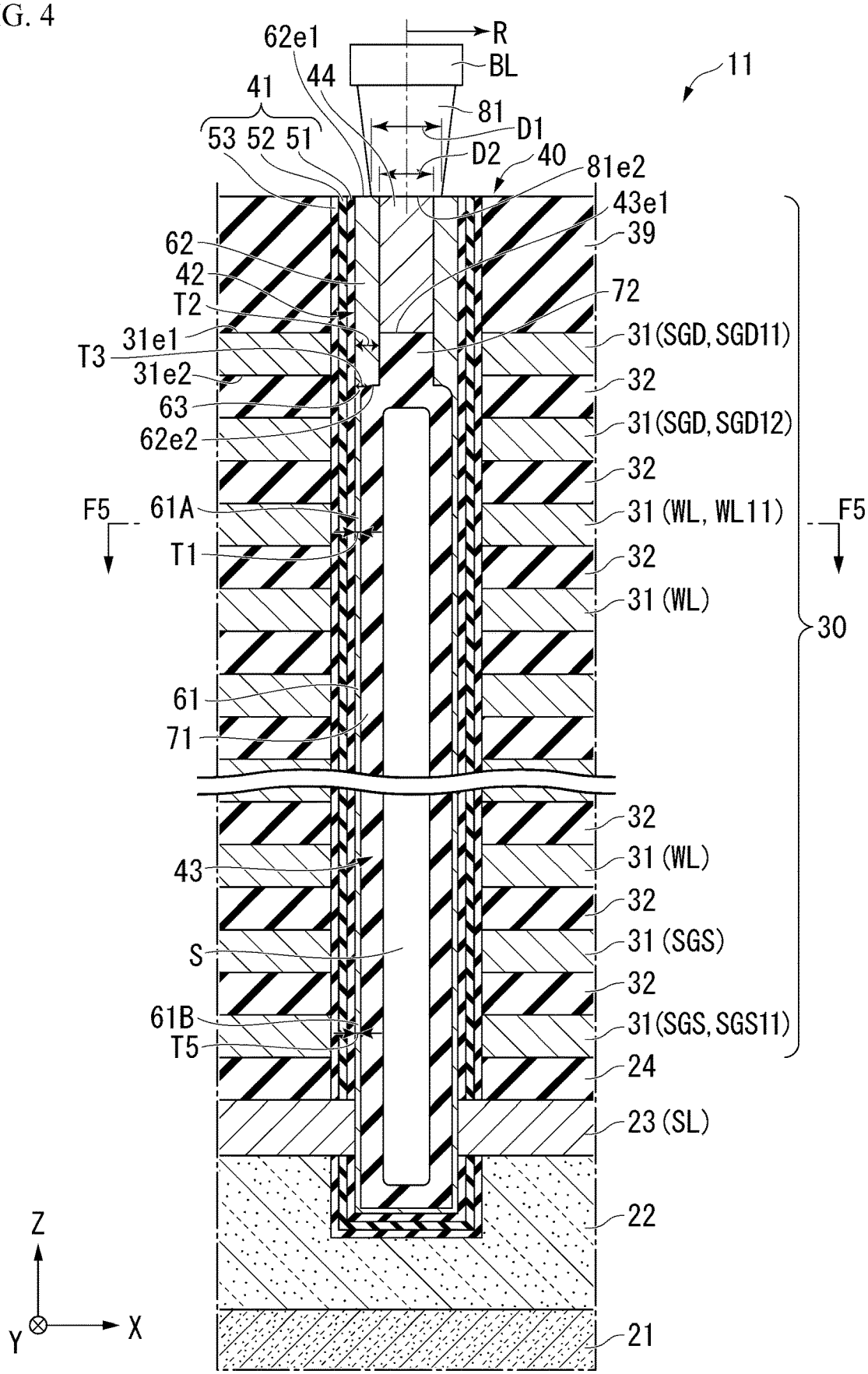
FIG. 4 is a cross-sectional view showing a part of the memory cell array according to the first embodiment.

FIG. 4 is a cross-sectional view showing a part of the memory cell array 11. The pillar 40 is formed in a cylindrical shape or inverse circular truncated cone shape. The pillar 40 extends in the Z direction. The pillar 40 penetrates through the multi-layered body 30, the insulating layer 24, and the conductive layer 23. A lower end portion of the pillar 40 penetrates into the semiconductor layer 22. The pillar 40 includes, for example, a multi-layered film 41, the channel layer 42, an insulating core 43, and a cap portion 44.

The multi-layered film 41 is provided on an outer-periphery of the channel layer 42. The multi-layered film 41 is located between the plurality of the conductive layers 31 and the channel layer 42 in the R direction. The multi-layered film 41 is an example of "memory film". The multi-layered film 41 includes, for example, a tunnel-insulating film 51, a charge-trap film 52, and a block-insulating film 53.

The tunnel-insulating film 51 is located between the channel layer 42 and the charge-trap film 52 in the R direction. The tunnel-insulating film 51 is formed in, for example, an annular shape along an outer peripheral face of the channel layer 42. The tunnel-insulating film 51 extends in the Z direction along the channel layer 42. The tunnel-insulating film 51 extends in the Z direction over most of the pillar 40. The tunnel-insulating film 51 is a potential barrier between the channel layer 42 and the charge-trap film 52. The tunnel-insulating film 51 includes silicon oxide, or silicon oxide and silicon nitride.

The charge-trap film 52 is provided on an outer-periphery of the tunnel-insulating film 51. The charge-trap film 52 is located between the tunnel-insulating film 51 and the block-insulating film 53. When viewed from another viewpoint, the charge-trap film 52 is located between the plurality of the conductive layers 31 and the channel layer 42. The charge-trap film 52 extends in the Z direction over most of the pillar 40. The charge-trap film 52 has a plurality of crystal defects (trapping level) and is a functional film capable of trapping electric charge by the crystal defects. The charge-trap film 52 is formed of, for example, silicon nitride. Of the charge-trap film 52, a portion adjacent to each word line WL is an example of "charge storage part".

The block-insulating film 53 is provided on an outer-periphery of the charge-trap film 52. The block-insulating film 53 is located between the plurality of the conductive layers 31 and the charge-trap film 52 in the R direction. The block-insulating film 53 is an insulating film that suppresses back tunneling. The back tunneling is a phenomenon in which an electric charge returns from the word line WL to the charge-trap film 52. The block-insulating film 53 extends in the Z direction over most of the pillar 40. The block-insulating film 53 is a layered structure film in which a plurality of insulating films such as a silicon oxide film, a metal oxide film, or the like are layered. An example of the metal oxide is aluminum oxide. The block-insulating film 53 may also include a high dielectric constant material (high-k material) such as silicon nitride or hafnium oxide.

The channel layer 42 is provided inside the multi-layered film 41. The channel layer 42 is formed in an annular shape. The channel layer 42 extends in the Z direction over the entire length (the entire height) of the pillar 40. Of the multi-layered film 41, a portion located at the same height as the source line SL is removed. Accordingly, a lower end portion of the channel layer 42 is in contact with the source line SL and is connected to the source line SL. The channel layer 42 is formed of a semiconductor material such as polysilicon. Impurities may be doped into the channel layer 42. The impurity contained in the channel layer 42 is at least any one selected from the group consisting of, for example, carbon, phosphorus, boron, and germanium. The channel layer 42 forms a channel and electrically connects the bit line BL and the source line SL when a voltage is applied to the word line WL. In the embodiment, the channel layer 42 includes a thin-film portion 61, a second portion 62, and a third portion 63.

The thin-film portion 61 is located lower than the second portion 62 and the third portion 63. The thin-film portion 61 is formed in, for example, an annular shape. The thin-film portion 61 extends in the Z direction. At least a part of the thin-film portion 61 is located between the plurality of the word lines WL and the insulating core 43 in the R direction. In the embodiment, a part (for example, upper end portion) of the thin-film portion 61 is located between the second drain-side select gate line SGD12 and the insulating core 43 in the R direction. Another part (for example, lower end portion) of the thin-film portion 61 is located between the plurality of the source-side select gate lines SGS and the insulating core 43 in the R direction. The thin-film portion 61 occupies most of the channel layer 42 in the Z direction.

The thin-film portion 61 forms a body part of the channel layer 42. A lower end portion of the thin-film portion 61 is in contact with the source line SL and is connected to the source line SL.

The thin-film portion 61 includes a first portion 61A that is a part of the thin-film portion 61 in the Z direction. The first portion 61A is located between the uppermost word line WL11 and the insulating core 43 in the R direction. The first portion 61A is formed in, for example, an annular shape. The first portion 61A extends in the Z direction.

Figure 5:
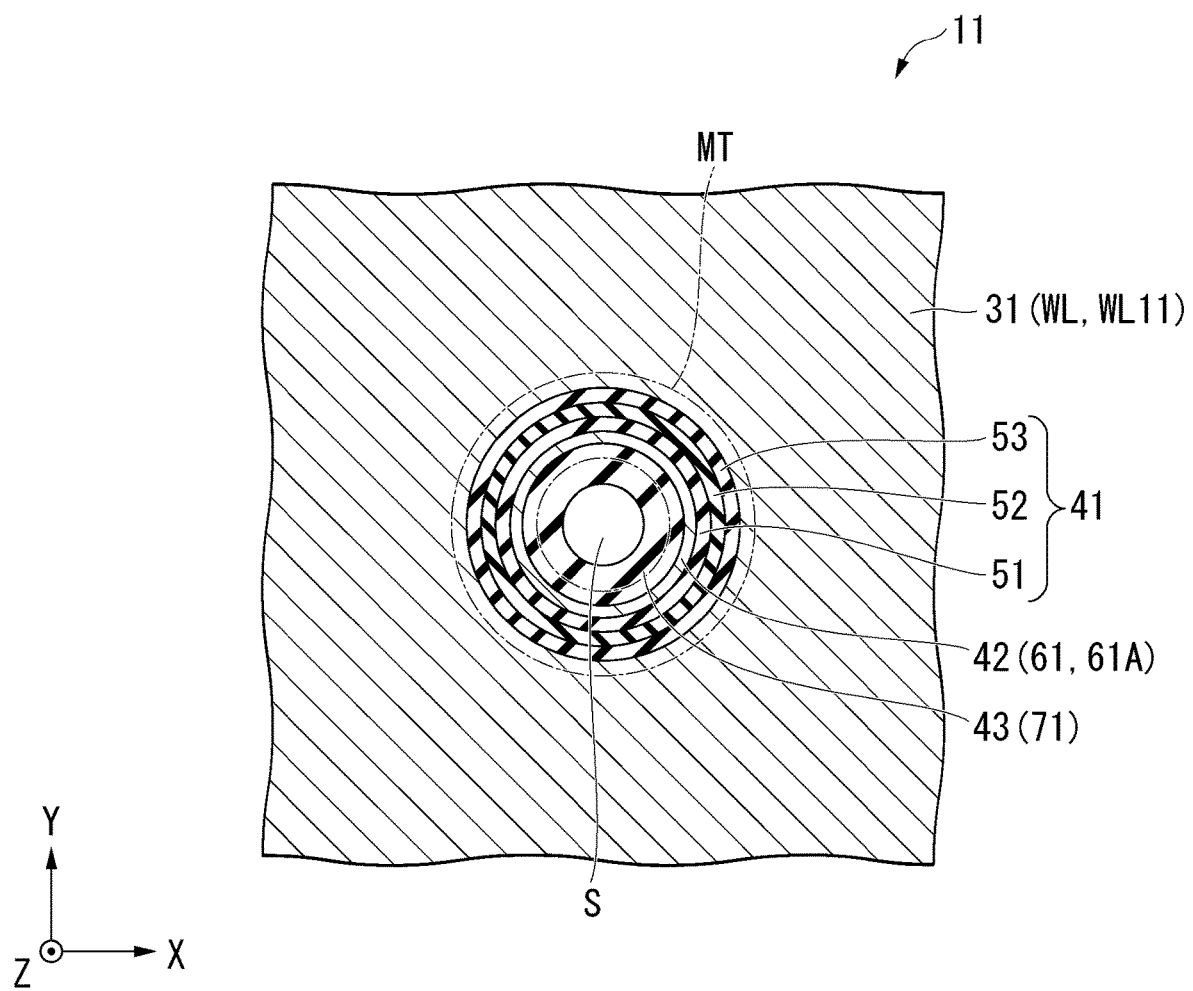
FIG. 5 is a cross-sectional view taken along the line F5-F5 of the memory cell array shown in FIG. 4.

FIG. 5 is a cross-sectional view taken along the line F5-F5 of the memory cell array 11 shown in FIG. 4. A MANOS (Metal-Al-Nitride-Oxide-Silicon) type memory cell transistor MT is formed at the same height as each word line WL in the Z direction. The memory cell transistor MT is formed of end portions of the word lines WL adjacent to the pillar 40, the block-insulating film 53, the charge-trap film 52, the tunnel-insulating film 51, and the thin-film portion 61 of the channel layer 42.

Note that, the memory cell array 11 may have a floating gate type charge storage part (floating gate electrode) serving as an electric charge accumulation film instead of the charge-trap film 52. A floating gate electrode is formed of, for example, polysilicon including impurities. The impurity contained in polysilicon is, for example, phosphorus or boron. The floating gate electrode is provided between the block-insulating film 53 and the tunnel-insulating film 51. In this case, the memory cell transistor MT using the floating gate is formed of the end portions of the word lines WL adjacent to the pillar 40, the block-insulating film 53, the charge-trap film 52, the tunnel-insulating film 51, and the thin-film portion 61 of the channel layer 42.

Returning to FIG. 4, the second portion 62 will be described. The second portion 62 is a thick film portion of the channel layer 42. The second portion 62 is located above the thin-film portion 61 and the third portion 63. The second portion 62 extends downward from above an upper end of the first drain-side select gate line SGD11 in the Z direction. At least a part of the second portion 62 is formed in, for example, an annular shape and extends in the Z direction. A film thickness T2 of the second portion 62 in the direction R is greater than a film thickness T1 of the first portion 61A in the direction R. For example, the film thickness T2 of the second portion 62 in the direction R is twice or more the film thickness T1 of the first portion 61A in the direction R. When viewed from another viewpoint, the film thickness T2 of the second portion 62 in the direction R is greater than the film thickness T1 of the first portion 61A in the direction R by 5 nm or more. The film thickness T2 of the second portion 62 is, for example, a film thickness of a portion of the second portion 62 positioned next to the first drain-side select gate line SGD11.

In the embodiment, the second portion 62 forms an upper end portion of the channel layer 42. A part of the second portion 62 is located between the insulating layer 39 and the cap portion 44 in the R direction. A contact 81 described below is in contact with an upper end of the second portion 62 in the Z direction. The contact 81 has a lower end 81e2 connected to the pillar 40. An inner diameter D2 of the second portion 62 of the channel layer 42 (for example, an inner diameter of an upper end 62e1 of the second portion 62) is smaller than an outer diameter D1 of the lower end 81e2 of the contact 81. The upper end 62e1 of the second portion 62 is in contact with the contact 81 and is connected to the contact 81.

In the embodiment, a lower end 62e2 of the second portion 62 is closer to the silicon substrate 21 than an upper end 43e1 of the insulating core 43. That is, the second portion 62 extends from above the upper end 43e1 of the insulating core 43 to a position closer to the silicon substrate 21 than a part of the insulating core 43. A part of the second portion 62 is adjacent to the insulating core 43 in the R direction.

In the embodiment, the second portion 62 extends from above an upper end 31e1 (for example, upper surface) of the first drain-side select gate line SGD11 to a height at least the same as the upper end 31e1 of the first drain-side select gate line SGD11 (for example, upper surface) in the Z direction.

For example, the lower end 62e2 of the second portion 62 is closer to the silicon substrate 21 than the upper end 31e1 (for example, upper surface) of the first drain-side select gate line SGD11. That is, the second portion 62 extends from above the upper end 43e1 of the insulating core 43 to a position closer to the silicon substrate 21 than at least a part of the first drain-side select gate line SGD11. A part of the second portion 62 is located between at least a part of the first drain-side select gate line SGD11 and the insulating core 43 in the R direction. The upper end 31e1 of the first drain-side select gate line SGD11 is an end directed to the opposite side of the silicon substrate 21. The upper end 31e1 is an example of "first end".

Furthermore, in other words, in the embodiment, the second portion 62 extends to a height at least the same as a lower end 31e2 (for example, lower surface) of the first drain-side select gate line SGD11 in the Z direction. In other words, the second portion 62 extends from a first height to a second height. The first height is an example of a position above the upper end 31e1 of the first drain-side select gate line SGD11. The second height is an example of a position that is the same as the lower end 31e2 of the first drain-side select gate line SGD11 or that is lower than the lower end 31e2. In the Z direction, the lower end 62e2 of the second portion 62 is located at the same height as the lower end 31e2 (for example, lower surface) of the first drain-side select gate line SGD11 or is located closer to the silicon substrate 21 than the lower end 31e2 of the first drain-side select gate line SGD11. That is, the second portion 62 extends from above the upper end 43e1 of the insulating core 43 to be at the same height as the lower end 31e2 of the first drain-side select gate line SGD11 or extends to a position closer to the silicon substrate 21 than the lower end 31e2 of the first drain-side select gate line SGD11. The lower end 31e2 of the first drain-side select gate line SGD11 is an end directed to the silicon substrate 21. The lower end 31e2 is an example of "second end".

In a film thickness direction in the R direction, the film quality of the entire second portion 62 is the same as that of the first portion 61A. The term "the film quality of one film is the same as the other film" means that, for example, an impurity concentration contained in one film is the same as that of the other film. In this case, the same impurity concentration means that a difference in impurity concentration between one film and the other film is less than two times. That is, the term "the same film quality" means that a case in which, for example, the impurity concentration of one of the first portion 61A and the second portion 62 which has a lower impurity concentration than the other is $1\times10^{20}$ atoms·cm$^{-3}$, the impurity concentration of one of the first portion 61A and the second portion 62 which has a higher impurity concentration than the other is less than $2\times10^{20}$ atoms·cm$^{-3}$. Instead of the above, the term "the same film quality" may mean, for example, a particle diameter of a material contained in one film is the same as that of the other film. In this case, the same particle diameter means that a difference in particle diameter between one film and the other film is less than or equal to 30%.

The third portion 63 is located between the first portion 61A and the second portion 62 in the Z direction. The third portion 63 is a portion between the first portion 61A and the second portion 62. A film thickness of the third portion 63 is gradually changed in the third portion 63. The third portion 63 is formed in, for example, an annular shape. The third portion 63 extends in the Z direction. A film thickness T3 of the third portion 63 in the direction R is smaller than the film thickness T2 of the second portion 62 in the direction R and is larger than the film thickness T1 of the first portion 61A in the direction R.

In the embodiment, the third portion 63 gradually becomes thinner as the third portion 63 approaches the first portion 61A from the second portion 62. The closer the third portion 63 is located at the above (the closer to the second portion 62 in the Z direction), the larger the amount of change of the film thickness T3 is. The term "the amount of change of the film thickness" is a change amount of film thickness in the R direction depending on a change amount per unit of distance in the Z direction. In the embodiment, the closer the third portion 63 is located at the second portion 62 in the Z direction, the larger the film thickness T3 changes. The third portion 63 is formed in a circular arc shape directed obliquely upward at the outer-periphery of the third portion.

Next, the insulating core 43 will be described. The insulating core 43 is provided inside the channel layer 42. The insulating core 43 is implanted into a part of the inside of the channel layer 42. The insulating core 43 is formed of an insulation material such as silicon oxide. The insulating core 43 extends in the Z direction over most of the pillar 40 with the exception of an upper end portion of the pillar 40. In the Z direction, the upper end 43e1 of the insulating core 43 is located at the same height as the upper end 31e1 of the first drain-side select gate line SGD11 or is located above the upper end 31e1 of the first drain-side select gate line SGD11.

The insulating core 43 has a first portion 71 and a second portion 72. The first portion 71 of the insulating core 43 is located at the inner-periphery side of the thin-film portion 61 of the channel layer 42. A part of the first portion 71 of the insulating core 43 is formed in an annular shape along an inner peripheral face of the thin-film portion 61 of the channel layer 42. A part of the first portion 71 has a space portion S (air gap) formed therein. However, the space portion S is not essential for the semiconductor storage device 1. In contrast, the second portion 72 of the insulating core 43 is located at the inner-periphery side of the second portion 62 of the channel layer 42 and the third portion 63. The second portion 72 is tightly implanted into the insides of the second portion 62 of the channel layer 42 and the third portion 63.

The cap portion 44 is provided above the insulating core 43. The cap portion 44 is a conductor formed of a semiconductor material such as amorphous silicon. Impurities may be doped into the cap portion 44. The impurity contained in the cap portion 44 is at least any one selected from the group consisting of, for example, carbon, phosphorus, boron, and germanium. The cap portion 44 is located above the first portion 61A of the thin-film portion 61. The cap portion 44 is disposed inside the second portion 62 of the channel layer 42. For example, the cap portion 44 is implanted in the insides of the second portion 62 of the channel layer 42. The cap portion 44 and the second portion 62 of the channel layer 42 form the upper end portion of the pillar 40. The cap portion 44 is in contact with the contact 81 in the Z direction. The cap portion 44 is an example of "fourth portion".

<2.2.4 Upper Structure>

Each of the contacts 81 is provided on the pillar 40. The contact 81 extends in the Z direction. The contact 81 electrically connects the bit line BL and the channel layer 42 of the pillar 40. The contact 81 is formed of a conductive material such as tungsten.

The plurality of the bit lines BL are disposed in one side (upper side) of the multi-layered body 30 in the Z direction. Each of the bit lines BL is provided on the contact 81. The bit line BL is connected to the channel layer 42 of the pillar 40 via the contact 81. Consequently, by combination of the word line WL and the bit line BL, the memory cell transistor MT can be optionally selected from the plurality of the memory cell transistors MT three-dimensionally arranged.

<3. Manufacturing Method>

Next, an example of a method of manufacturing the semiconductor storage device 1 will be described.

FIGS. 6 to 10 are cross-sectional explanatory views showing a method of manufacturing the semiconductor storage device 1. First of all, the semiconductor layer 22, a sacrificial layer not shown in the drawings, and the insulating layer 24 are stacked in layers on the silicon substrate 21. The above-mentioned sacrificial layer is formed of, for example, silicon nitride. The above-mentioned sacrificial layer is an insulating layer to be replaced with the conductive layer 23 by a post-process.

Figure 6:
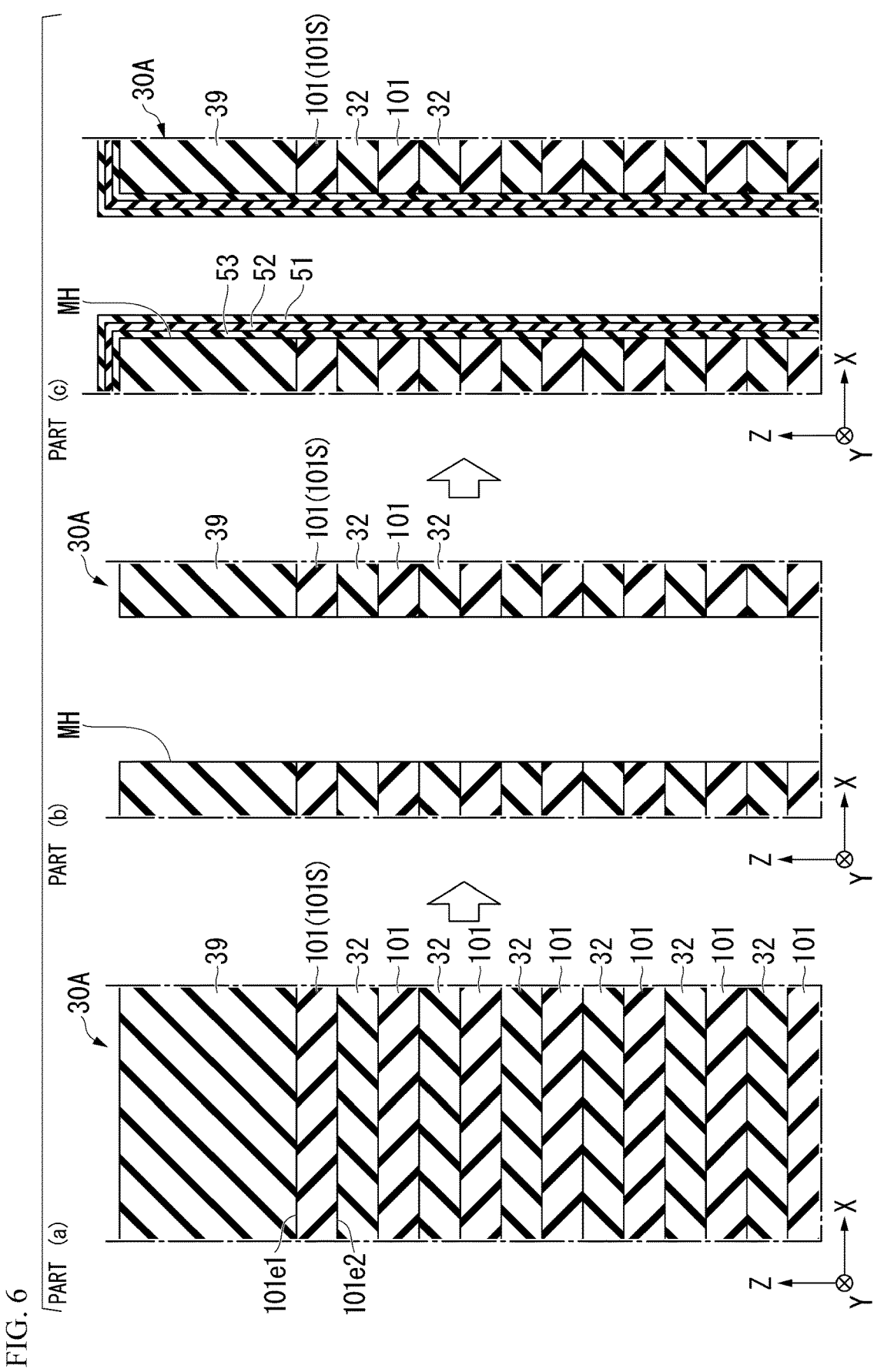
FIG. 6 is a cross-sectional explanatory view of a method of manufacturing the semiconductor storage device according to the first embodiment.

Next, as shown in part (a) of FIG. 6, a sacrificial layer 101 and the insulating layer 32 are alternately stacked in layers above the insulating layer 24. The sacrificial layer 101 is formed of an insulation material such as silicon nitride. The sacrificial layer 101 is different from the insulating layer 32 in material. The sacrificial layer 101 is an insulating layer to be replaced with the conductive layer 31 by a post-process. The sacrificial layer 101 is an example of "intermediate layer". The sacrificial layer 101 is an example of "first layer" of the manufacturing method. The insulating layer 32 is an example of "second layer" of the manufacturing method.

A sacrificial layer 101S is located at the uppermost position in the plurality of the sacrificial layers 101. In other words, the sacrificial layer 101S is furthest from the silicon substrate 21. The sacrificial layer 101S has an upper end 101e1 (for example, upper surface) and a lower end 101e2 (for example, lower surface). The upper end 101e1 is directed to the opposite side of the silicon substrate 21. The lower end 101e2 is directed to the silicon substrate 21. The upper end 101e1 of the sacrificial layer 101S is located at a height corresponding to the upper end 31e1 of the first drain-side select gate line SGD11 to be formed by a post-process. The lower end 101e2 of the sacrificial layer 101 is located at a height corresponding to the lower end 31e2 of the first drain-side select gate line SGD11 to be formed by a post-process. Note that, instead of provision of the sacrificial layer 101, the conductive layer 31 and the insulating layer 32 may be directly and alternately stacked in layers. In this case, the conductive layer 31 corresponds to an example of "intermediate layer". Next, the insulating layer 39 is stacked on the sacrificial layer 101S. Accordingly, a mid multi-layered body 30A is formed. The mid multi-layered body 30A is a multi-layered body formed in a middle of the manufacturing method.

After that, as shown in part (b) of FIG. 6, a memory hole MH is provided on the mid multi-layered body 30A. The memory hole MH is an opening extending in the Z direction. The memory hole MH is formed so as to penetrate through the mid multi-layered body 30A, the insulating layer 24, and a sacrificial layer not shown in the drawings in the Z direction and to reach a middle of the semiconductor layer 22. The memory hole MH is an example of "space portion". Next, as shown in part (c) of FIG. 6, a material used to form the block-insulating film 53k, a material used to form the charge-trap film 52, and a material used to form the tunnel-insulating film 51 are supplied to an inner surface of the memory hole MH in order. Therefore, the block-insulating film 53, the charge-trap film 52, and the tunnel-insulating film 51 are sequentially formed inside the memory hole MH.

Figure 7:
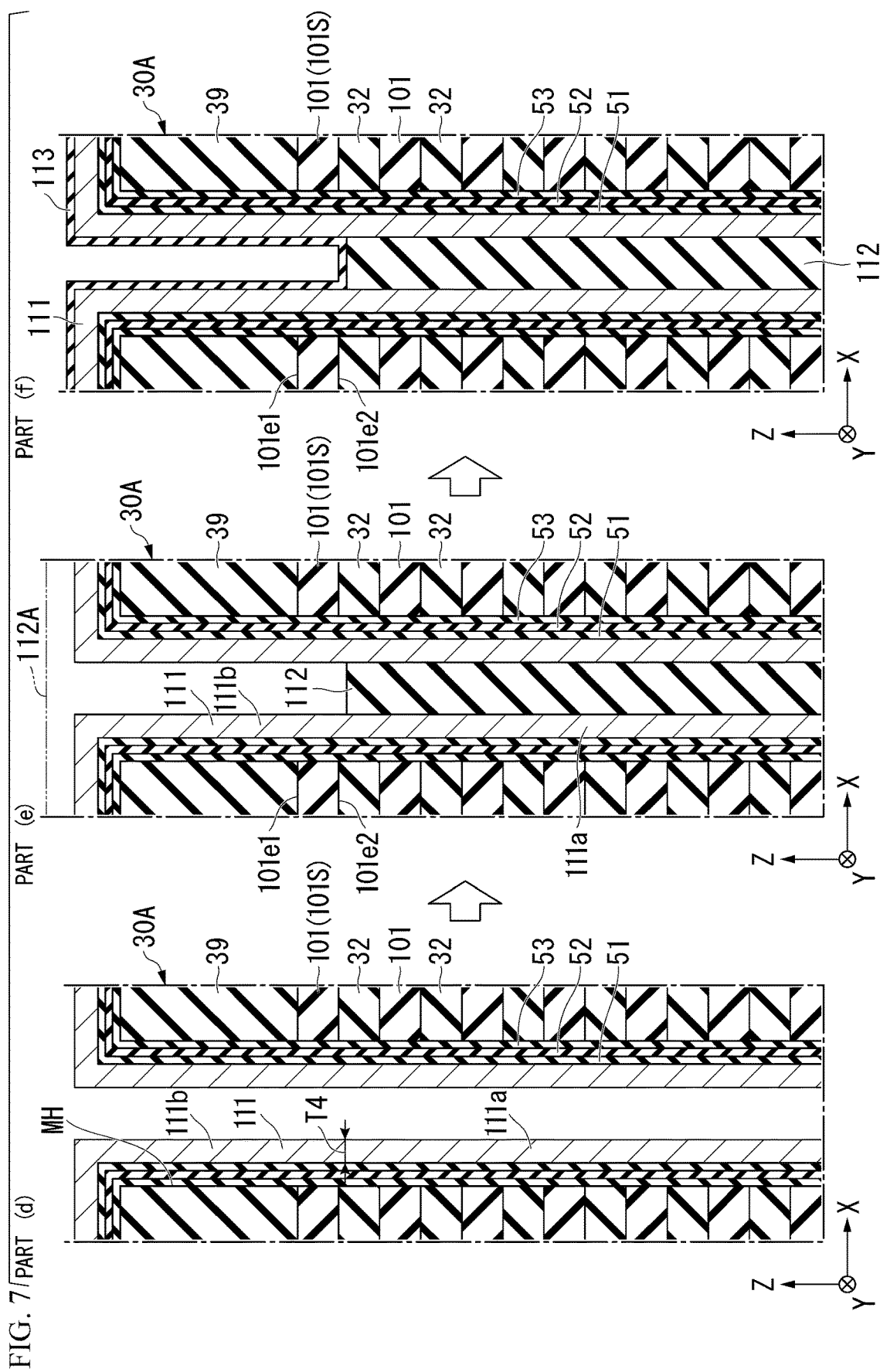
FIG. 7 is a cross-sectional explanatory view of a method of manufacturing the semiconductor storage device according to the first embodiment.

After that, as shown in part (d) of FIG. 7, a material used to form the channel layer 42 is supplied to the inside of the memory hole MH, and a semiconductor layer 111 having an annular shape along the inner peripheral face of the tunnel-insulating film 51 is formed inside the memory hole MH. A film thickness T4 of the semiconductor layer 111 in the direction R is the same as the film thickness T2 of the second portion 62 of the channel layer 42 in the direction R. The semiconductor layer 111 has a first region 111a and a second region 111b. The first region 111a is a region to be the thin-film portion 61 of the aforementioned channel layer 42. The second region 111b is a region to be the second portion 62 of the aforementioned channel layer 42 (thick film portion).

Next, as shown in part (e) of FIG. 7, an insulation material such as silicon oxide is supplied to the inner-periphery side of the semiconductor layer 111, and an insulating portion 112A that fills the inside of the annular semiconductor layer 111 is formed. Subsequently, an upper portion of the insulating portion 112A is removed by, for example, etching. In the embodiment, a portion of the insulating portion 112A located above the lower end 101e2 of the sacrificial layer 101S is removed. Consequently, an insulating portion 112 is formed inside the annular semiconductor layer 111. The insulating portion 112 is present inside the first region 111a of the semiconductor layer 111 but is not present inside the second region 111b of the semiconductor layer 111. A material used to form the insulating portion 112 (for example, silicon oxide) is an example of "first material".

After that, as shown in part (f) of FIG. 7, an insulation material such as silicon nitride is supplied to an upper surface of the semiconductor layer 111, an inner peripheral face of the semiconductor layer 111 located inside the memory hole MH, and an upper surface of the insulating portion 112. Therefore, a protective film 113 is provided over the upper surface of the semiconductor layer 111, the inner peripheral face of the semiconductor layer 111 located inside the memory hole MH, and the upper surface of the insulating portion 112. That is, a position lower than the uppermost upper end 101e1 of the uppermost sacrificial layer 101S of a plurality of first layers (i.e., the plurality of the sacrificial layers 101) is covered with the protective film 113. In other words, the protective film 113 covers a region from the upper surface of the semiconductor layer 111 to the position lower than the upper end 101e1 of the uppermost sacrificial layer 101S of the plurality of the sacrificial layers. A material used to form the protective film 113 (for example, silicon nitride) is an example of "second material". The second material is different from the first material. A region including an upper portion of the semiconductor layer 111 and a position closer to the silicon substrate 21 than the upper end 101e1 of the sacrificial layer 101S is covered with the protective film 113. Furthermore, in other words, in the embodiment, a region including the upper portion of the semiconductor layer 111 and a position closer to the silicon substrate 21 than the lower end 101e2 of the sacrificial layer 101S is covered with the protective film 113.

Figure 8:
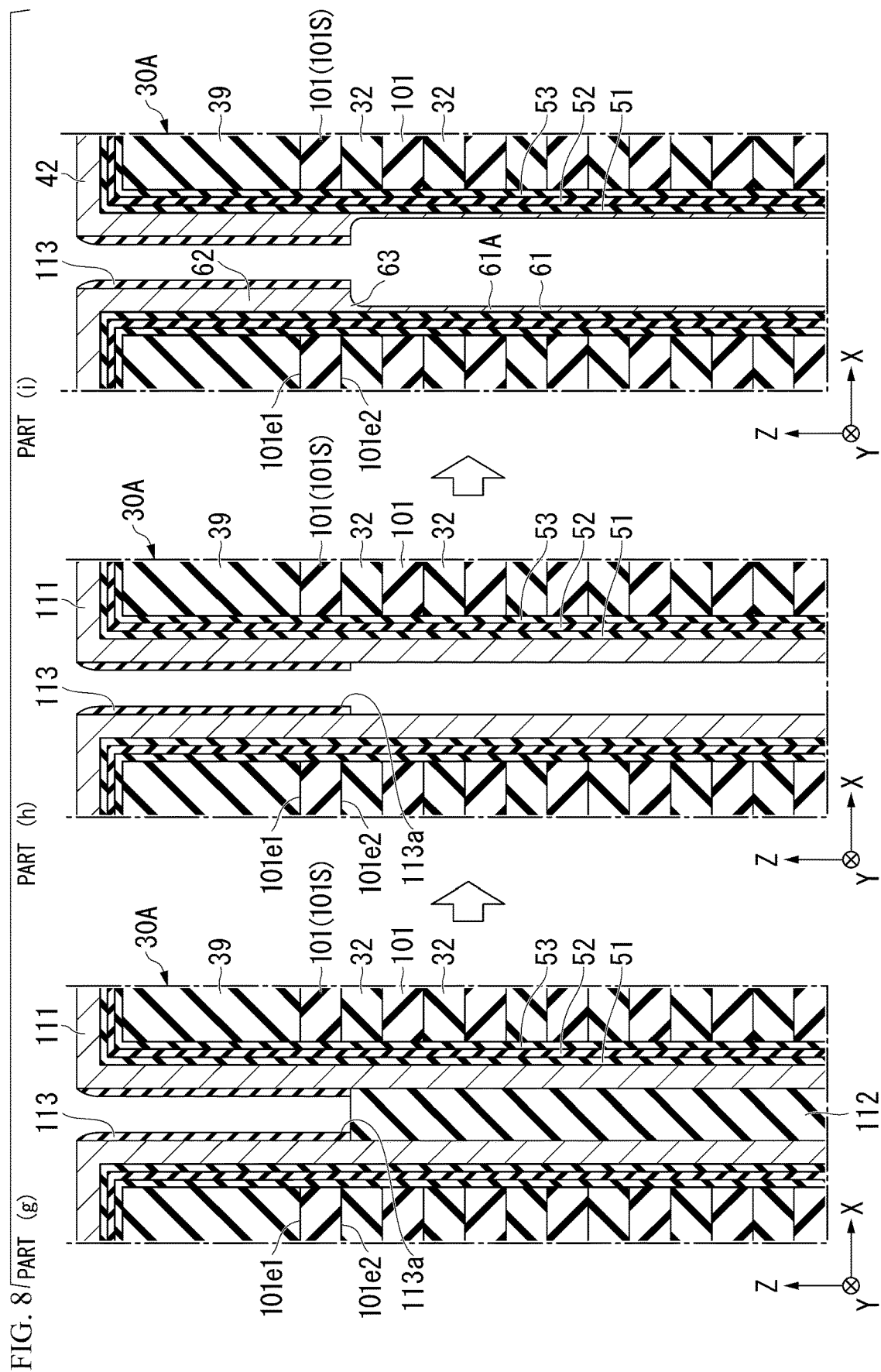
FIG. 8 is a cross-sectional explanatory view of a method of manufacturing the semiconductor storage device according to the first embodiment.

Next, as shown in part (g) of FIG. 8, portions of the protective film 113 located at the upper surface of the semiconductor layer 111 and the upper surface of the insulating portion 112 are removed by, for example, reactive ion etching (RIE: Reactive Ion Etching). Accordingly, the protective film 113 having an opening portion 113a that causes the insulating portion 112 to be exposed is formed.

After that, as shown in part (h) of FIG. 8, the insulating portion 112 is removed by etching through the opening portion 113a of the protective film 113. Subsequently, as shown in part (i) of FIG. 8, the semiconductor layer 111 is subjected to slimming in a state in which the protective film 113 is provided. Consequently, while maintaining a film thickness of a region of the semiconductor layer 111 which corresponds to the second portion 62 of the channel layer 42, thinning of a thickness of a region of the semiconductor layer 111 which corresponds to the thin-film portion 61 of the channel layer 42 and the third portion 63 is carried out. That is, etching with respect to the semiconductor layer 111 is carried out such that the film thickness of the first region 111a of the semiconductor layer 111 in the X direction is smaller than the film thickness of the second region 111b of the semiconductor layer 111 in the X direction. As a result, the channel layer 42 including the thin-film portion 61, the second portion 62, and the third portion 63 is formed.

Figure 9:
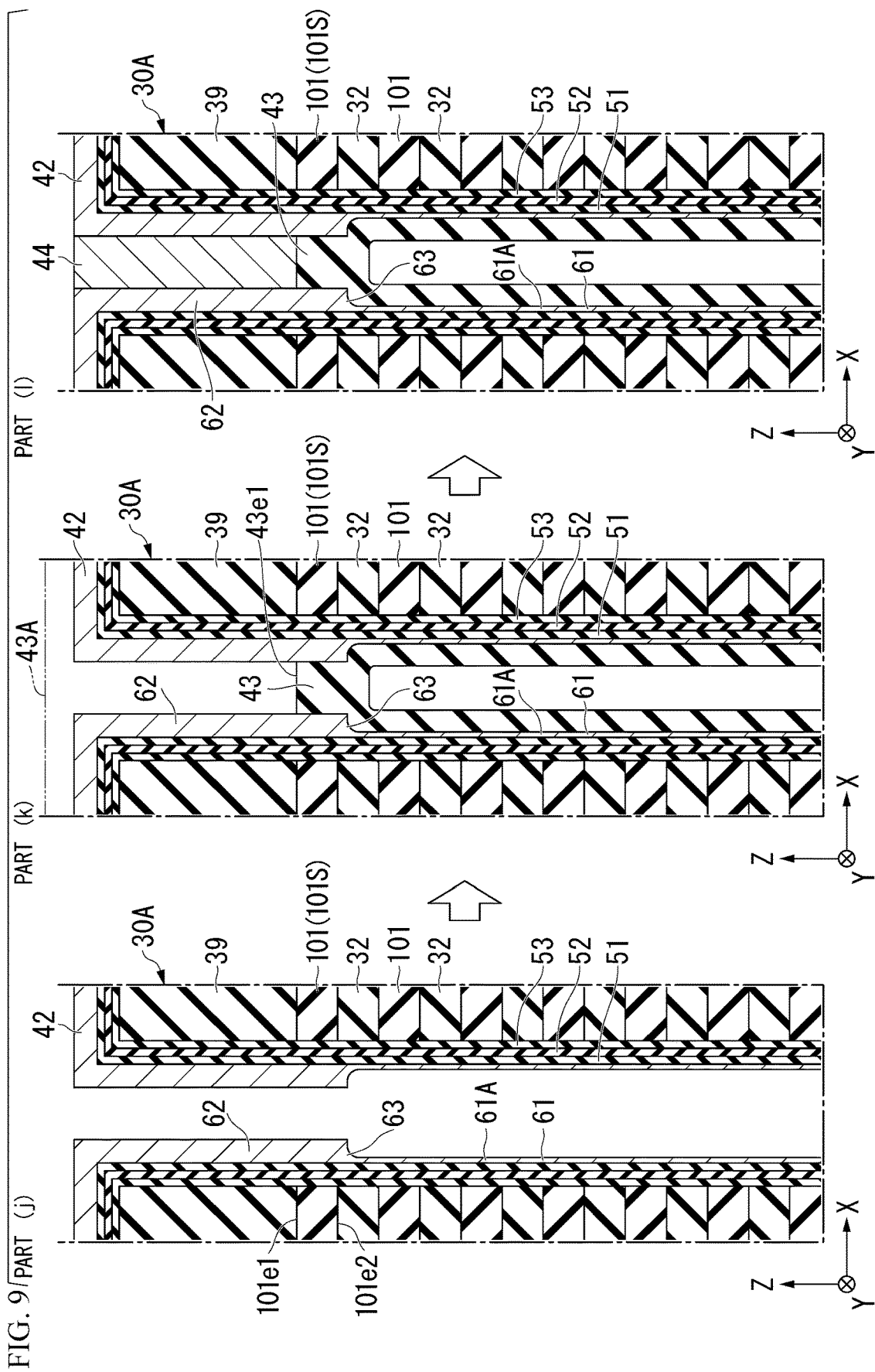
FIG. 9 is a cross-sectional explanatory view of a method of manufacturing the semiconductor storage device according to the first embodiment.

After that, as shown in part (j) of FIG. 9, the protective film 113 is removed by, for example, etching. Next, as shown in part (k) of FIG. 9, an insulation material such as silicon oxide is supplied to the inner-periphery side of the channel layer 42, and an insulating portion 43A that fills the inside of the channel layer 42 is formed. Subsequently, an upper portion of the insulating portion 43A is removed by, for example, etching such that the upper portion of the insulating portion 43A reaches a position corresponding to the upper end 43e1 of the insulating core 43 in the Z direction. Accordingly, the insulating core 43 is formed on the inner-periphery side of the channel layer 42. After that, as shown in part (1) of FIG. 9, a semiconductor material such as amorphous silicon is supplied to the inner-periphery side of the channel layer 42, and the cap portion 44 is formed.

Figure 10:
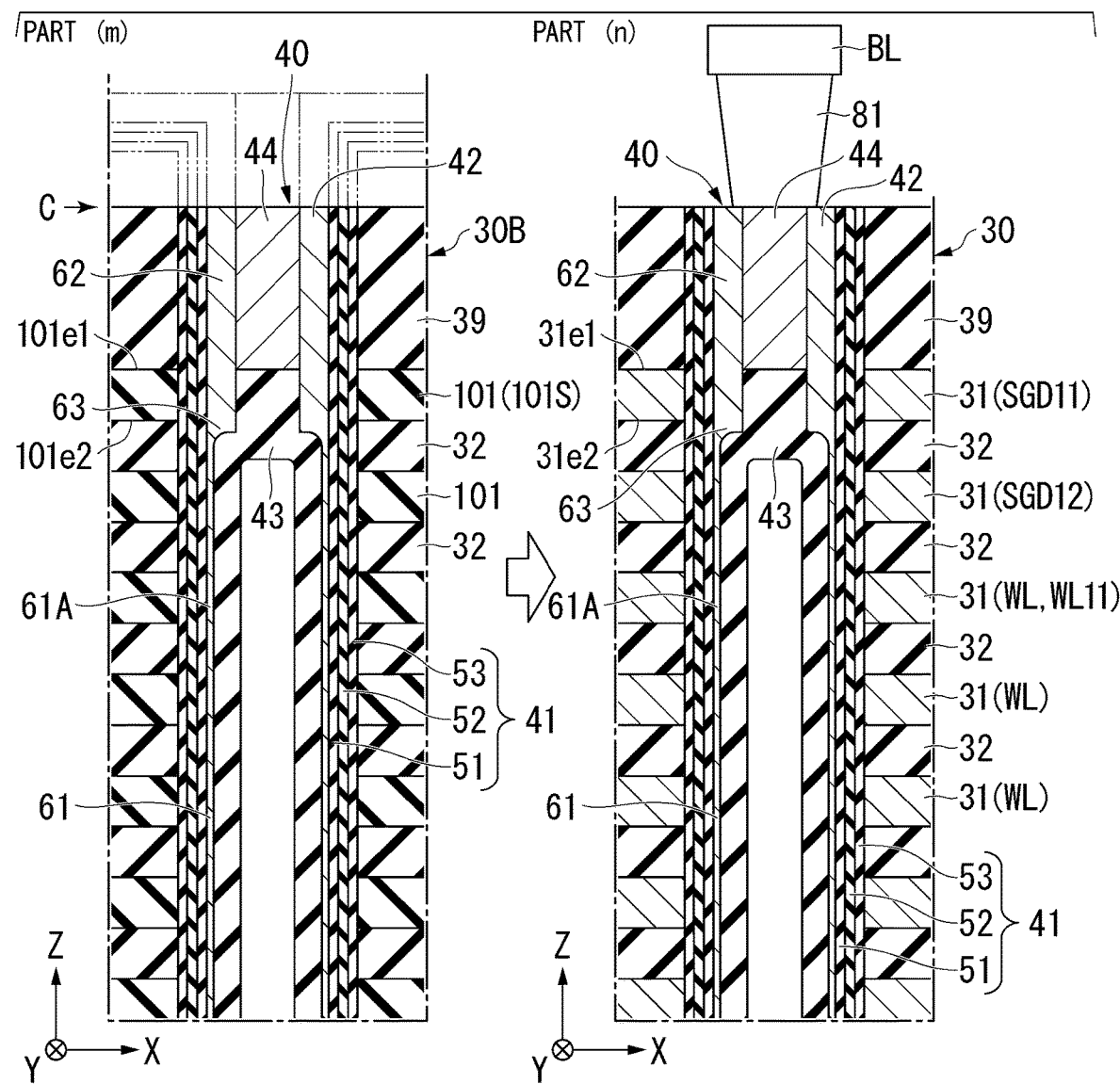
FIG. 10 is a cross-sectional explanatory view of a method of manufacturing the semiconductor storage device according to the first embodiment.

Next, as shown in part (m) of FIG. 10, cutting is carried out at a cutting surface C, an unwanted part of the multi-layered film 41, an unwanted part of the channel layer 42, an unwanted part of the cap portion 44, an unwanted part of the insulating layer 39 are removed, and a mid multi-layered body 30B and the pillar 40 are thereby formed. The mid multi-layered body 30B is a multi-layered body formed in a middle of the manufacturing method.

After that, etching solution is supplied through a hole or a trench not shown in the drawings, and the sacrificial layer provided between the semiconductor layer 22 and the insulating layer 24 is removed in the lower structure. At this time, a portion of the multi-layered film 41 located at the same height as the sacrificial layer to be removed is also removed. Furthermore, a conductive material is supplied to a space obtained by removing the sacrificial layer, and the conductive layer 23 (the source line SL) is thereby formed. Next, etching solution is supplied through a hole or a trench not shown in the drawings, and the plurality of the sacrificial layers 101 included in the mid multi-layered body 30B are removed. Subsequently, a material used to form the conductive layer 31 is supplied to a space obtained by removing the plurality of the sacrificial layers 101. Accordingly, the word line WL, the drain-side select gate line SGD, and the source-side select gate line SGS are formed. As a result, the multi-layered body 30 is formed. Thereafter, as shown in part (n) of FIG. 10, the contact 81, the bit line BL, and the like are formed, and the semiconductor storage device 1 is completed.

<4. Advantage>

In recent years, in order to further improve the electrical characteristics of a semiconductor storage device, reduction in the thickness of a channel layer has been studied. However, when a channel layer is a thin film through the entire length in the Z direction, the following phenomenon occurs. For example, an electrical resistance (channel resistance) may increase at an upper end portion of a channel layer. When the electrical resistance of the channel layer increases, an amount of an electrical current (cell current) flowing in the channel layer becomes low at, for example, the time of reading out data, and the data read characteristics may be degraded. Additionally, when the channel layer is thin at a portion at which the drain-side select gate lines SGD are adjacent to each other, hole generation efficiency may be lowered due to gate-induced drain leakage (GIDL) in a data erasure operation. In this case, the efficiency of the data erasure operation may be lowered. Additionally, in the case in which a film thickness of the upper end portion of the channel layer is thin, when etching is carried out to form the insulating core 43 at the inner-periphery side of the channel layer, a part of the upper end portion of the channel layer may be broken, and a part of a sacrificial layer and a part of an insulating layer included in the mid multi-layered body may be damaged. In this case, process yield of semiconductor storage devices may be lowered.

In contrast to this, in the embodiment, the channel layer 42 includes the first portion 61A (thin-film portion) and the second portion 62 (thick film portion). The first portion 61A is located between the uppermost word line WL and the insulating core 43. The second portion 62 is located on the opposite side of the silicon substrate 21 with respect to the first portion 61A. The second portion 62 has a film thickness in the R direction twice or more the film thickness of the first portion 61A in the R direction. The second portion 62 extends in the Z direction to a position closer to the silicon substrate 21 than the upper end 31e1 of the drain-side select gate line SGD (for example, the first drain-side select gate line SGD11). With this configuration, the electrical resistance becomes low at the upper end portion of the channel layer 42, and cell current increases. Additionally, when the thick film portion of the channel layer 42 is present at a portion at which the drain-side select gate lines SGD are adjacent to each other, hole generation efficiency can be improved due to gate-induced drain leakage in the data erasure operation. In this case, the efficiency of the data erasure operation can be improved. Additionally, when the thick film portion is present at the upper end portion of the channel layer 42, when etching is carried out to form the insulating core 43, damage to a part of the sacrificial layer 101 and a part of the insulating layer 32 included in the mid multi-layered body 30A can be suppressed. In this case, process yield of semiconductor storage devices 1 can be improved.

In the embodiment, in the Z direction, the second portion 62 of the channel layer 42 is located at the same height as the lower end 31e2 of the drain-side select gate line SGD (for example, the first drain-side select gate line SGD11) or extends to a position closer to the silicon substrate 21 than the lower end 31e2 of the drain-side select gate line SGD (for example, the first drain-side select gate line SGDl 1). With this configuration, since the channel layer 42 is thick at most portions at which the drain-side select gate lines SGD are adjacent to each other, the hole generation efficiency can be further improved due to gate-induced drain leakage in the data erasure operation.

In the embodiment, the channel layer 42 includes the third portion 63 located between the first portion 61A and the second portion 62 in the Z direction. The third portion 63 has the film thickness T3 gradually becomes thinner as third portion 63 approaches the first portion 61A from the second portion 62. The closer the third portion 63 is to the second portion 62 in the Z direction, the larger the amount of change of the film thickness T3 is. With this configuration, a material used to form the insulating core 43 easily penetrates into a portion lower than the second portion 62 of the channel layer 42, and the insulating core 43 is easily formed at the inner-periphery side of the first portion 61A of the channel layer 42. Accordingly, it is easy to further reliably ensure a required insulation.

In the embodiment, the semiconductor storage device 1 further includes the contact 81 located on the opposite side of the silicon substrate 21 with respect to the pillar 40. The contact 81 is connected to the pillar 40. The contact 81 is in contact with the second portion 62 of the channel layer 42 in the Z direction. With this configuration, since the contact 81 is connected to the first portion 61A via the second portion 62 of the channel layer 42, it is possible to further reduce an electrical resistance between the contact 81 and the first portion 61A of the channel layer 42. Consequently, the cell current further increases, and the data read characteristics can be further improved.

In the embodiment, the second portion 62 of the channel layer 42 is formed in an annular shape. The contact 81 has the lower end 81e2 connected to the pillar 40. The inner diameter D2 of the second portion 62 of the channel layer 42 is smaller than the outer diameter D1 of the lower end 81e2 of the contact 81. With this configuration, even when there is a component tolerance, the contact 81 is likely to be in contact with the second portion 62 of the channel layer 42. Accordingly, it is possible to further reliably reduce an electrical resistance between the contact 81 and the first portion 61A of the channel layer 42.

In the embodiment, the method of manufacturing the semiconductor storage device 1 includes: providing the protective film 113 on the semiconductor layer 111 such that the region including the upper portion of the semiconductor layer 111 and a position closer to the silicon substrate 21 than the upper end 101e1 of the sacrificial layer 101S is covered with the protective film 113; and forming the channel layer 42 including the first portion 61A and the second portion 62 by carrying out slimming to the semiconductor layer 111 in a state in which the protective film 113 is provided. With this configuration, it is easy to form the second portion 62 over a relatively long region in the Z direction.

<5. Modified Example of Manufacturing Method>

Next, a modified example of the above-described method of manufacturing the semiconductor storage device 1 will be described. In the modified example, a material used to form the insulating portion 112 and the protective film 113 is different from the first embodiment. Note that, processes other than those described below are the same as the processes of the manufacturing method according to the first embodiment.

Figure 11:
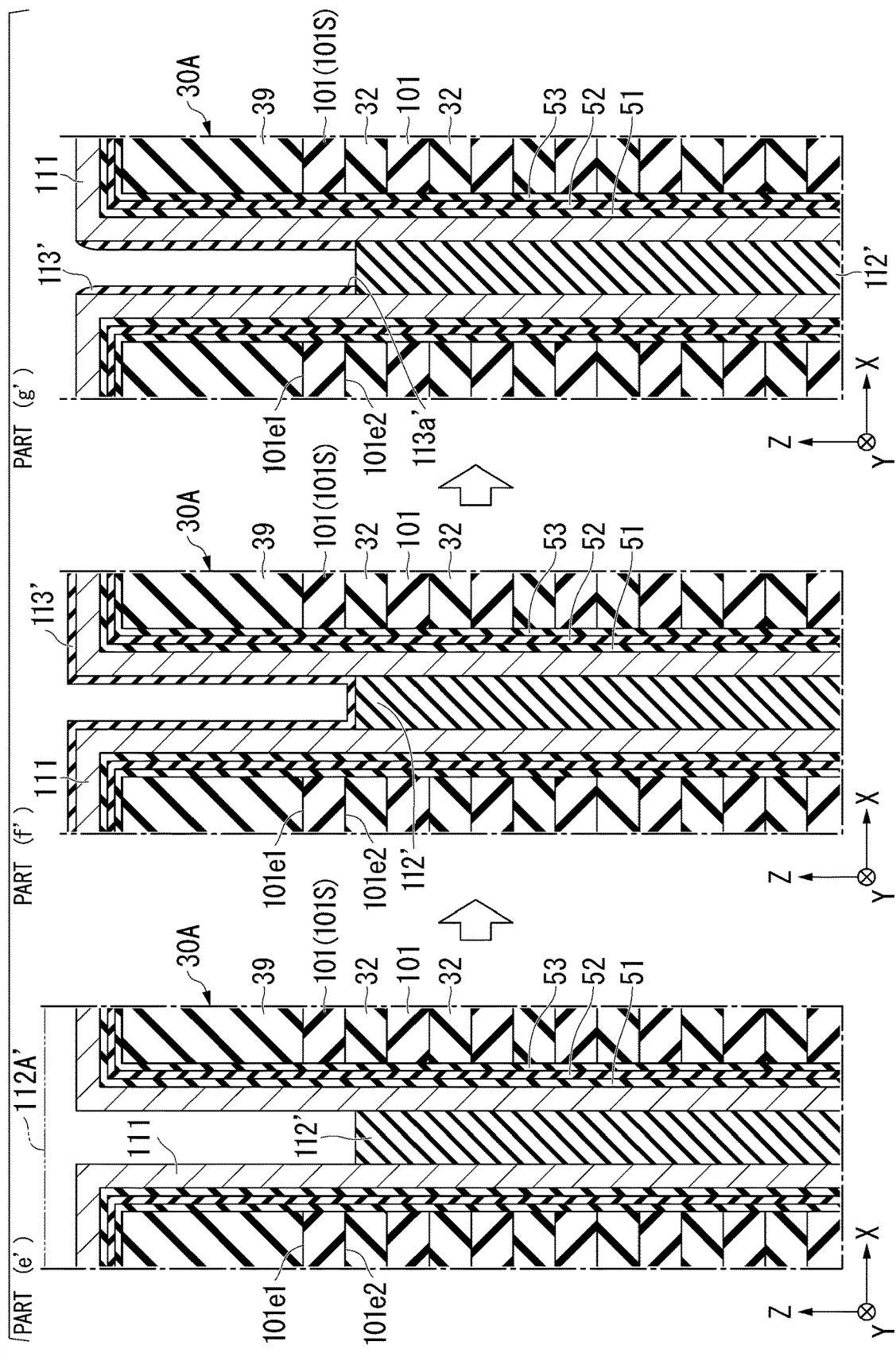
FIG. 11 is a cross-sectional explanatory view of the manufacturing method according to a modified example of the first embodiment.
Figure 12:
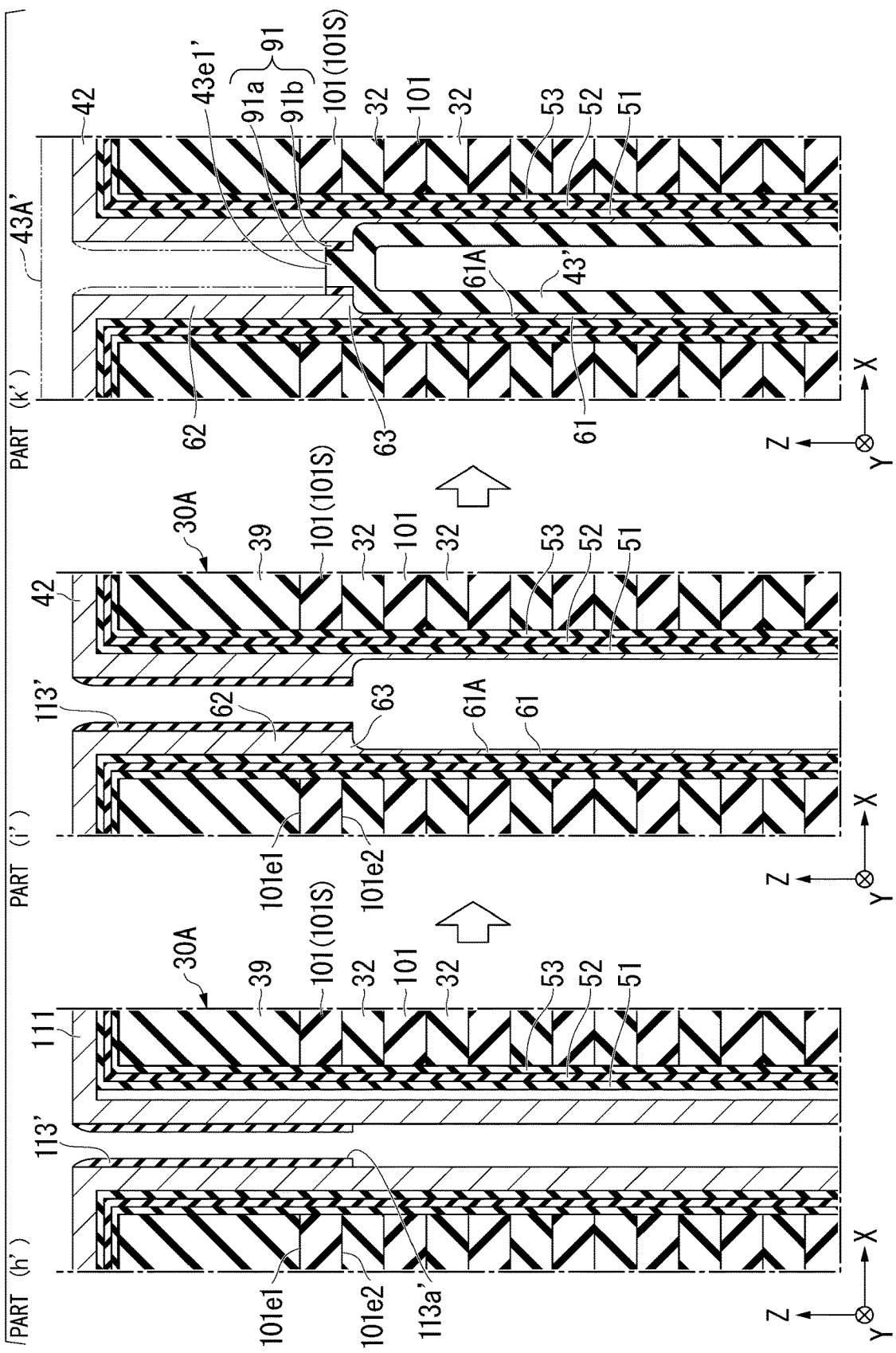
FIG. 12 is a cross-sectional explanatory view of the manufacturing method according to a modified example of the first embodiment.

FIGS. 11 and 12 are cross-sectional explanatory views of a modified example of a method of manufacturing the semiconductor storage device 1. The manufacturing method according to the modified example is the same as the manufacturing method according to the first embodiment in the processes shown to part (d) of FIG. 7 described in the first embodiment. Therefore, in the following explanation, processes after the process shown in part (d) of FIG. 7 described in the first embodiment will be described. Parts (e'), (f'), (g'), (h'), (i'), and (k') of FIG. 11 and FIG. 12 show the processes corresponding the processes shown in parts (e), (f), (g), (h), (i), and (k) of FIGS. 7 to 9 described in the first embodiment, respectively.

As shown in part (e') of FIG. 11 in the modified example, an insulation material such as silicon nitride is supplied to the inner-periphery side of the semiconductor layer 111, and an insulating portion 112A' that fills the inside of the annular semiconductor layer 111 is formed. Subsequently, an upper portion of the insulating portion 112A' is removed by, for example, etching. In the modified example, a portion of the insulating portion 112A' located above the lower end 101e2 of the sacrificial layer 101S is removed. Consequently, an insulating portion 112' is formed inside the annular semiconductor layer 111. A material used to form the insulating portion 112' (for example, silicon nitride) is an example of "first material".

After that, as shown in part (f') of FIG. 11, an insulation material such as silicon oxide is supplied to an upper surface of the semiconductor layer 111, an inner peripheral face of the semiconductor layer 111 located inside the memory hole MH, and an upper surface of the insulating portion 112'. Therefore, a protective film 113' is provided over the upper surface of the semiconductor layer 111, the inner peripheral face of the semiconductor layer 111 located inside the memory hole MH, and the upper surface of the insulating portion 112'. A material used to form the protective film 113' (for example, silicon oxide) is an example of "second material". The second material is different from the first material.

Next, as shown in part (g') of FIG. 11, portions of the protective film 113' located at the upper surface of the semiconductor layer 111 and the upper surface of the insulating portion 112' are removed by, for example, reactive ion etching (RIE). Accordingly, the protective film 113' having an opening portion 113a' that causes the insulating portion 112' to be exposed is formed.

After that, as shown in part (h') of FIG. 12, the insulating portion 112' is removed by etching through the opening portion 113a' of the protective film 113'. Subsequently, as shown in part (i') of FIG. 12, the semiconductor layer 111 is subjected to slimming in a state in which the protective film 113' is provided. Consequently, while maintaining a film thickness of a region of the semiconductor layer 111 which corresponds to the second portion 62, thinning of a thickness of a region of the semiconductor layer 111 which corresponds to the thin-film portion 61 and the third portion 63 is carried out. As a result, the channel layer 42 including the thin-film portion 61, the second portion 62, and the third portion 63 is formed.

Here, in the modified example, a process of removing the protective film 113' (process corresponding part (j) of FIG. 9 according to the first embodiment) is not carried out. For this reason, next, as shown in part (k') of FIG. 12, an insulation material such as silicon oxide is supplied to the inner-periphery side of the channel layer 42, and an insulating portion 43A' that fills the inside of the channel layer 42 is formed. In the modified example, in a state in which the protective film 113' remains, the insulating portion 43A' that fills the inside of the channel layer 42 is formed. Subsequently, most of the protective film 113' and an upper portion of the insulating portion 43A' are removed by, for example, etching such that most of the protective film 113' and the upper portion of the insulating portion 43A' reach a position corresponding to the upper end 43e1' of the insulating core 43' in the Z direction. Accordingly, the insulating core 43' is formed on the inner-periphery side of the channel layer 42. Subsequent processes are the same as those of the first embodiment.

With this configuration, a process of removing the protective film 113' can be omitted as compared with the manufacturing method according to the first embodiment. As a result, it is possible to increase a degree of manufacturability of the semiconductor storage device 1. In the modified example, a part of the protective film 113' remains in the semiconductor storage device 1 serving as a completed product. For example, the insulating core 43' has an upper end portion 91 adjacent to the second portion 62 of the channel layer 42 in the R direction. The upper end portion 91 includes an insulator 91a and an insulating film 91b. The insulator 91a is located at a central portion of the insulating core 43' in the direction R. The insulating film 91b is located between the insulator 91a and the channel layer 42 in the R direction. The insulator 91a is formed of a part of the insulating portion 43A' formed by the process shown in part (k') of FIG. 12. The insulating film 91b is formed of a part of the protective film 113' formed by the process shown in part (f) of FIG. 11. The insulator 91a and the insulating film 91b are different from each other in composition or characteristics. The term "the insulator and the insulating film are different from each other in composition" means that, for example, impurities contained in the insulator and the insulating film are different from each other. The term "the insulator and the insulating film are different from each other in characteristics" means that, for example, the insulator and the insulating film are different from each other in density or film stress. The insulator 91a is an example of "first insulating film". The insulating film 91b is an example of "second insulating film".

Second Embodiment

Next, a second embodiment will be described. The second embodiment is different from the first embodiment in that the second portion 62 of the channel layer 42 further extends downward. Configurations other than those described below are the same as the first embodiment.

Figure 13:
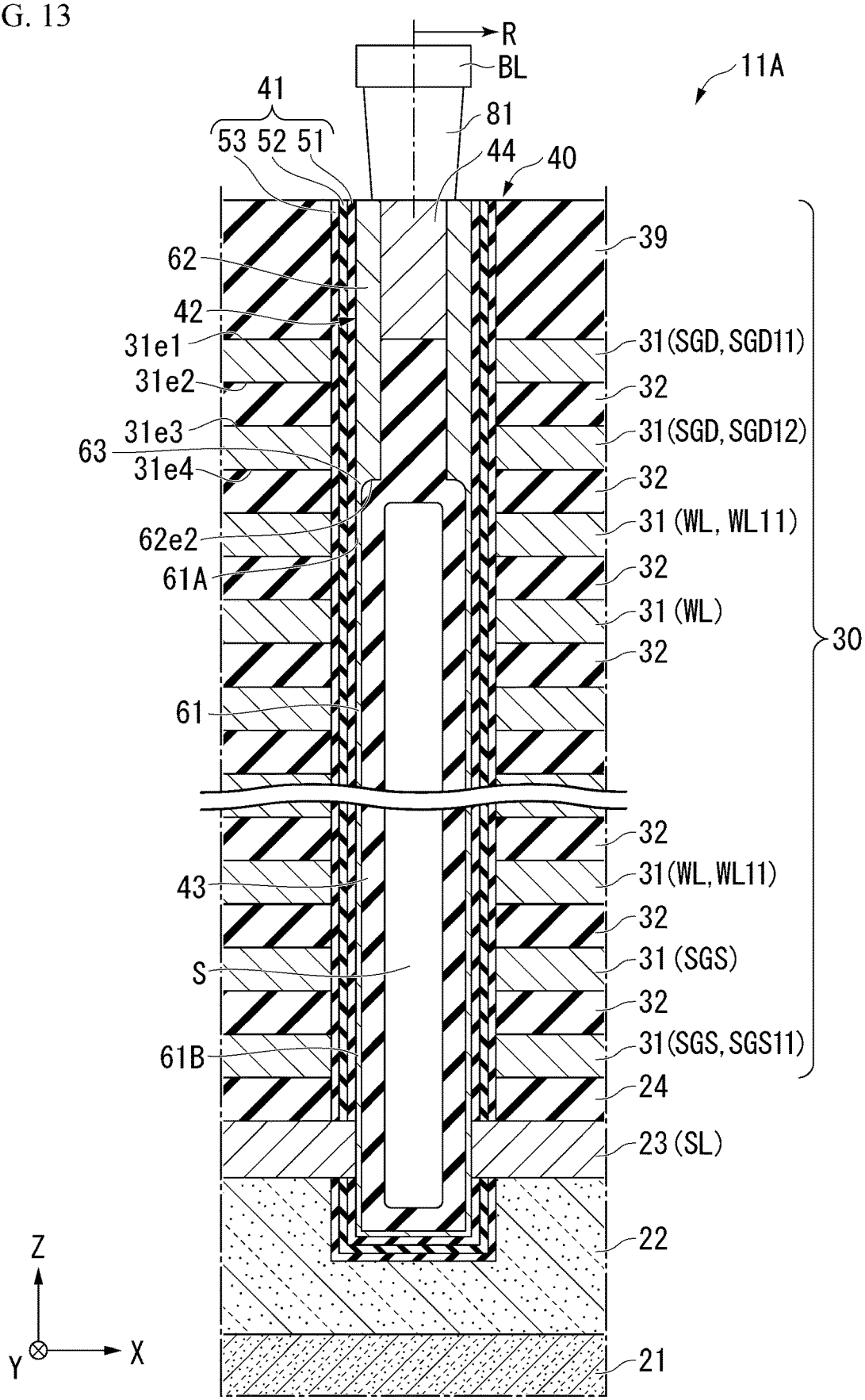
FIG. 13 is a cross-sectional view showing a part of the memory cell array according to a second embodiment.

FIG. 13 is a cross-sectional view showing a part of a memory cell array 11A according to the second embodiment. In the embodiment, the lower end 62e2 of the second portion 62 of the channel layer 42 is closer to the silicon substrate 21 than an upper end 31e3 (for example, upper surface) of the second drain-side select gate line SGD12. That is, the second portion 62 extends from above the upper end 43e1 of the insulating core 43 to a position closer to the silicon substrate 21 than at least a part of the second drain-side select gate line SGD12. A part of the second portion 62 is located between at least a part of the second drain-side select gate line SGD12 and the insulating core 43 in the R direction. The upper end 31e3 of the second drain-side select gate line SGD12 is an end directed to the opposite side of the silicon substrate 21. The upper end 31e3 is an example of "third end".

Furthermore, in other words, in the embodiment, the second portion 62 of the channel layer 42 extends to a height at least the same as a lower end of the second drain-side select gate line SGD12. In the Z direction, the lower end 62e2 of the second portion 62 of the channel layer 42 is located at the same height as the lower end 31e4 (for example, lower surface) of the second drain-side select gate line SGD12 or is located closer to the silicon substrate 21 than the lower end 31e4 of the second drain-side select gate line SGD12. That is, the second portion 62 extends from above the upper end 43e1 of the insulating core 43 to be at the same height as the lower end 31e4 of the second drain-side select gate line SGD12 or extends to a position closer to the silicon substrate 21 than the lower end 31e4 of the second drain-side select gate line SGD12. With this configuration, the hole generation efficiency can be further improved due to gate-induced drain leakage in the data erasure operation.

Third Embodiment

Next, a third embodiment will be described. The third embodiment is different from the second embodiment in that the second portion 62 of the channel layer 42 further extends downward. Configurations other than those described below are the same as the second embodiment.

Figure 14:
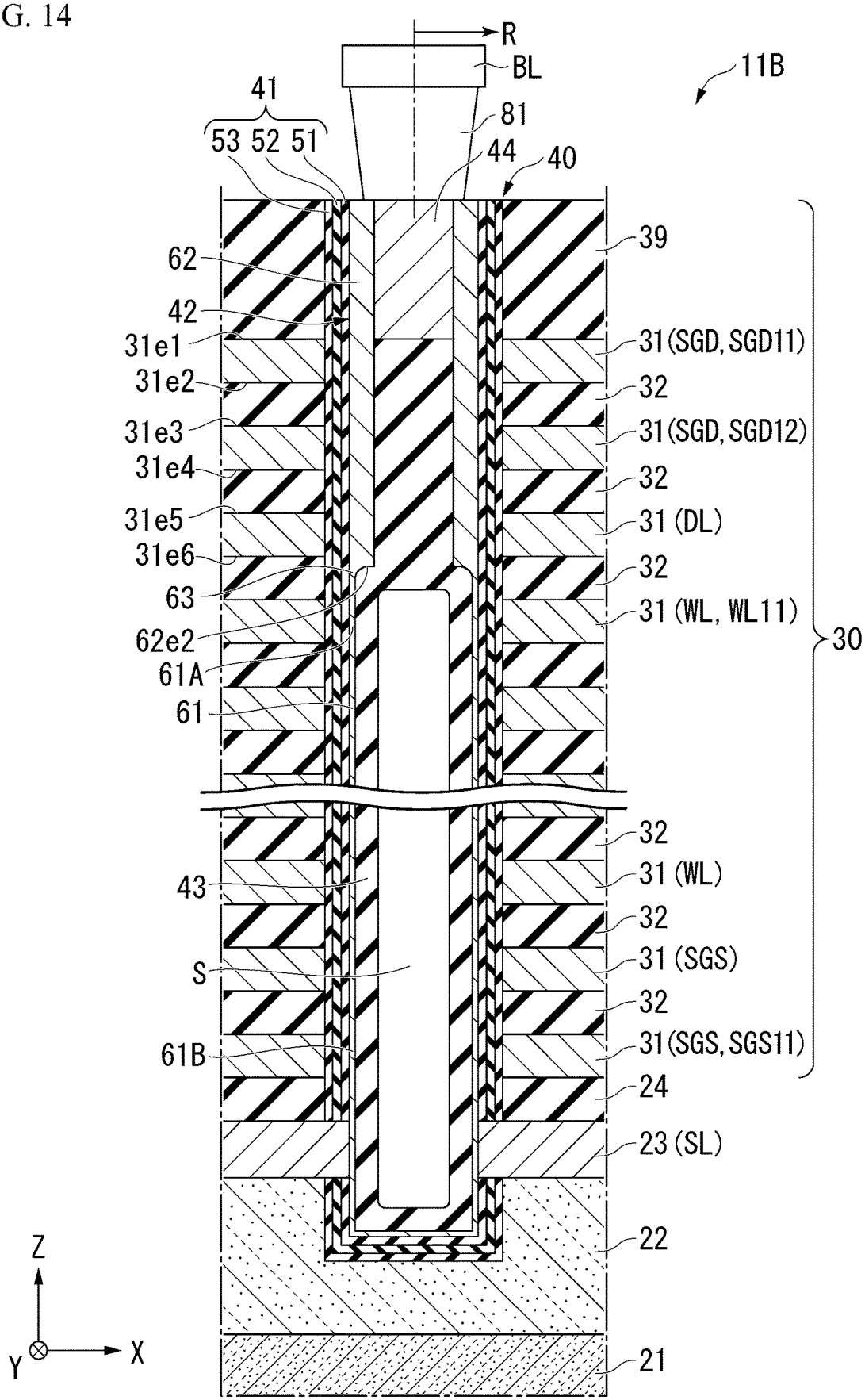
FIG. 14 is a cross-sectional view showing a part of the memory cell array according to a third embodiment.

FIG. 14 is a cross-sectional view showing a part of a memory cell array 11B according to the third embodiment. In the embodiment, the plurality of the conductive layers 31 included in the multi-layered body 30 include a dummy line DL. The dummy line DL is located between the drain-side select gate line SGD and the plurality of the word lines WL in the Z direction. The dummy line DL means a conductive layer not connected to a transistor functioning as a cell transistor MT. The dummy line DL functions as a buffer portion between the drain-side select gate line SGD and the plurality of the word lines WL. The buffer portion causes a voltage applied to the drain-side select gate line SGD to be less easily transmitted to the word line WL.

In the embodiment, the lower end 62e2 of the second portion 62 of the channel layer 42 is closer to the silicon substrate 21 than an upper end 31e5 of the dummy line DL. That is, the second portion 62 extends from above the upper end 43e1 of the insulating core 43 to a position closer to the silicon substrate 21 than at least a part of the dummy line DL. A part of the second portion 62 is located between at least a part of the dummy line DL and the insulating core 43 in the R direction.

Furthermore, in other words, in the embodiment, the lower end 62e2 of the second portion 62 of the channel layer 42 is located at the same height as the lower end 31e6 of the dummy line DL or is located closer to the silicon substrate 21 than the lower end 31e6 of the dummy line DL in the Z direction. That is, the second portion 62 extends from above the upper end 43e1 of the insulating core 43 to be at the same height as the upper end 43e1 of the insulating core 43 or extends to a position closer to the silicon substrate 21 than the lower end 31e6 of the dummy line DL. With this configuration, it may be possible to further reduce an electrical resistance of the channel layer 42.

Certain embodiments and modified examples have been described above. However, the embodiments and the modified examples are not limited to the above-mentioned example. For example, the number of the drain-side select gate lines SGD, the number of the word lines WL, and the number of the dummy lines DL, which are included in one multi-layered body 30, are not limited to the above-mentioned example.

Note that, the semiconductor storage device 1 may not include the silicon substrate 21. The semiconductor storage device 1 may include, for example, an array chip including the above-mentioned multi-layered body 30 and the plurality of the pillars 40, and a circuit chip formed separately from the array chip. The array chip may be bonded to the circuit chip such that the array chip is inverse with respect to the circuit chip. The above-mentioned array chip includes, for example, the memory cell array 11. The above-mentioned circuit chip includes, for example, the command register 12, the address register 13, a control circuit (sequencer) 14, the driver module 15, the row decoder module 16, and the sense amplifier module 17. In the semiconductor storage device 1, a bonding metal is implanted at a position corresponding to a bonding surface of the aforementioned array chip and a bonding surface of the aforementioned circuit chip. Transistors (for example, transistors forming the row decoder module 16 or the sense amplifier module 17) provided on a substrate that configures the memory cell array 11 of the above-mentioned memory cell array and the aforementioned circuit chip are electrically connected to each other via the bonding metal. In the semiconductor storage device 1, the silicon substrate 21 may not be present in a finished product by being peeled off. For this reason, in the aforementioned explanation, "the opposite side of the silicon substrate 21" may be referred to as "upper", and "the side closer to the silicon substrate 21" may be referred to as "lower". Note that, "upper" and "lower" in the present specification are expressions for convenience to explain a positional relationship between constituent members but are not to determine a vertical direction (direction of gravitational force) in a finished product.

According to at least one of the embodiments described above, the semiconductor storage device includes a multi-layered body and a channel layer. A plurality of gate electrode layers included in the multi-layered body include a plurality of first gate electrode layers and one or more second gate electrode layers. One or more second gate electrode layers are located above the plurality of the first gate electrode layers when the bit line is located at the upper side in the first direction. The channel layer includes a first portion and a second portion. The first portion is located between the uppermost first gate electrode layer of the plurality of the first gate electrode layers and the insulating core. The second portion extends from above the upper end of an uppermost second gate electrode layer of the second gate electrode layers to a height at least the same as the lower end of the uppermost second gate electrode layer. The film thickness of the second portion is larger than the film thickness of the first portion. With this configuration, it is possible to improve the electrical characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Note that, a constituent material of the cap portion 44 is, for example, amorphous silicon. A material used to form the cap portion 44 may be polysilicon formed by crystallizing amorphous silicon via, for example, a heating process. In other words, a constituent material of the cap portion 44 may be the same constituent material as the channel layer 42.

As shown in FIG. 4, the source-side select gate line SGS is another example of each of "first conductive layer" and "first gate electrode layer". Hereinbelow, for convenience of explanation, of the plurality (for example, two) of the source-side select gate lines SGS, the source-side select gate line SGS (lowermost source-side select gate line SGS)

closest to the silicon substrate 21 is referred to as "source-side select gate line SGS11". The source-side select gate line SGS11 is an example of "lowermost first gate electrode layer" and "lowermost gate electrode layer".

The thin-film portion 61 includes a fifth portion 61B serving as a portion of the thin-film portion 61 in the Z direction. The fifth portion 61B is located between the source-side select gate line SGS11 and the insulating core 43 in the R direction. The fifth portion 61B is formed in, for example, an annular shape. The fifth portion 61B extends in the Z direction.

The film thickness T2 of the second portion 62 in the R direction is larger than a film thickness T5 of the fifth portion 61B in the R direction. For example, the film thickness T2 of the second portion 62 in the direction R is twice or more the film thickness T5 of the fifth portion 61B in the direction R. When viewed from another viewpoint, the film thickness T2 of the second portion 62 in the direction R is greater than the film thickness T5 of the fifth portion 61B in the direction R by 5 nm or more.

What is claimed is:

1. A semiconductor storage device comprising:
a stacked body comprising a plurality of gate electrode layers and a plurality of insulating layers, the plurality of gate electrode layers and the plurality of insulating layers alternately stacked in a first direction one layer by one layer;
a pillar extending in the first direction in the stacked body, the pillar comprising an insulating core, a channel layer, and a memory film, the channel layer being provided between the plurality of the gate electrode layers and the insulating core, the memory film being provided between the plurality of the gate electrode layers and the channel layer; and
a bit line provided in one side in the first direction of the stacked body, wherein
the plurality of the gate electrode layers include a plurality of first gate electrode layers and one or more second gate electrode layers, a plurality of memory cell transistors are formed at intersection portions between the plurality of first gate electrode layers and the channel layer, the one or more second gate electrode layers are provided above the plurality of the first gate electrode layers when a side of the bit line is defined as above side, one or more selection transistors are formed at intersection portions between the one or more second gate electrode layers and the channel layer,
the channel layer includes a first portion and a second portion, the first portion is arranged between an uppermost first gate electrode layer among the plurality of the first gate electrode layers and the insulating core, the second portion extends from a first height to a second height, the first height is above an upper end of an uppermost second gate electrode layer among the one or more second gate electrode layers, the second height is the same as a lower end of the uppermost second gate electrode layer or lower,
a film thickness of the second portion in a second direction crossing the first direction is greater than a film thickness of the first portion in the second direction, and
the film thickness of the second portion in the second direction is greater than or equal to the film thickness of the first portion in the second direction by 5 nm or more.

2. A semiconductor storage device comprising:
a stacked body comprising a plurality of gate electrode layers and a plurality of insulating layers, the plurality of gate electrode layers and the plurality of insulating layers alternately stacked in a first direction one layer by one layer;
a pillar extending in the first direction in the stacked body, the pillar comprising an insulating core, a channel layer, and a memory film, the channel layer being provided between the plurality of the gate electrode layers and the insulating core, the memory film being provided between the plurality of the gate electrode layers and the channel layer; and
a bit line provided in one side in the first direction of the stacked body, wherein
the plurality of the gate electrode layers include a plurality of first gate electrode layers and one or more second gate electrode layers, a plurality of memory cell transistors are formed at intersection portions between the plurality of first gate electrode layers and the channel layer, the one or more second gate electrode layers are provided above the plurality of the first gate electrode layers when a side of the bit line is defined as above side, one or more selection transistors are formed at intersection portions between the one or more second gate electrode layers and the channel layer,
the channel layer includes a first portion and a second portion, the first portion is arranged between an uppermost first gate electrode layer among the plurality of the first gate electrode layers and the insulating core, the second portion extends from a first height to a second height, the first height is above an upper end of an uppermost second gate electrode layer among the one or more second gate electrode layers, the second height is the same as a lower end of the uppermost second gate electrode layer or lower,
a film thickness of the second portion in a second direction crossing the first direction is greater than a film thickness of the first portion in the second direction, and
the film thickness of the second portion in the second direction is twice or more the film thickness of the first portion in the second direction.

3. A semiconductor storage device comprising:
a stacked body comprising a plurality of gate electrode layers and a plurality of insulating layers, the plurality of gate electrode layers and the plurality of insulating layers alternately stacked in a first direction one layer by one layer;
a pillar extending in the first direction in the stacked body, the pillar comprising an insulating core, a channel layer, and a memory film, the channel layer being provided between the plurality of the gate electrode layers and the insulating core, the memory film being provided between the plurality of the gate electrode layers and the channel layer; and
a bit line provided in one side in the first direction of the stacked body, wherein
the plurality of the gate electrode layers include a plurality of first gate electrode layers and one or more second gate electrode layers, a plurality of memory cell transistors are formed at intersection portions between the plurality of first gate electrode layers and the channel layer, the one or more second gate electrode layers are provided above the plurality of the first gate electrode layers when a side of the bit line is defined as above side, one or more selection transistors are formed at intersection portions between the one or more second gate electrode layers and the channel layer, the channel layer includes a first portion and a second portion, the first portion is arranged between an uppermost first gate electrode layer among the plurality of the first gate electrode layers and the insulating core, the second portion extends from a first height to a second height, the first height is above an upper end of an uppermost second gate electrode layer among the one or more second gate electrode layers, the second height is the same as a lower end of the uppermost second gate electrode layer or lower, a film thickness of the second portion in a second direction crossing the first direction is greater than a film thickness of the first portion in the second direction, and the second portion extends to a position lower than an upper end of the insulating core.

4. The semiconductor storage device according to claim 1, wherein the second gate electrode layers include a first layer and a second layer, the first layer serving as the uppermost second gate electrode layer, the second layer being provided lower than the first layer in position, and the second portion extends to a height at least the same as a lower end of the second layer.

5. The semiconductor storage device according to claim 1, wherein the channel layer contains first and second portions each made of a material having particles, an impurity concentration contained in the second portion is the same as that in the first portion, or a diameter of the particles in the second portion is the same as that in the first portion.

6. The semiconductor storage device according to claim 1, wherein the channel layer includes a third portion, the third portion is provided between the first portion and the second portion in the first direction, the third portion gradually becomes thinner as the third portion approaches the first portion from the second portion, and the closer the third portion is to the second portion in the first direction, the larger an amount of change of the film thickness of the third portion.

7. The semiconductor storage device according to claim 1, further comprising:

a contact provided above the pillar, the contact electrically connecting the pillar and the bit line, wherein the contact is in contact with an upper end of the second portion in the first direction.

8. The semiconductor storage device according to claim 7, wherein at least a part of the second portion is formed in an annular shape, the contact has a lower end in contact with the pillar, and an inner diameter of the upper end of the second portion is smaller than an outer diameter of the lower end of the contact.

9. The semiconductor storage device according to claim 8, wherein the channel layer includes a fourth portion, the fourth portion is provided above the first portion, and the fourth portion is disposed inside the second portion in the pillar.

10. The semiconductor storage device according to claim 1, wherein the insulating core has an upper end portion adjacent to the second portion in the second direction, the upper end portion includes a first insulating film and a second insulating film, the second insulating film is provided between the first insulating film and the second portion in the second direction, and wherein impurities contained in the first insulating film are different from those of the second insulating film.

11. The semiconductor storage device according to claim 1, wherein the insulating core has a space portion.

12. The semiconductor storage device according to claim 2, wherein the second gate electrode layers include a first layer and a second layer, the first layer serving as the uppermost second gate electrode layer, the second layer being provided lower than the first layer in position, and the second portion extends to a height at least the same as a lower end of the second layer.

13. The semiconductor storage device according to claim 2, wherein the channel layer contains first and second portions each made of a material having particles, an impurity concentration contained in the second portion is the same as that in the first portion, or a diameter of the particles in the second portion is the same as that in the first portion.

14. The semiconductor storage device according to claim 2, wherein the channel layer includes a third portion, the third portion is provided between the first portion and the second portion in the first direction, the third portion gradually becomes thinner as the third portion approaches the first portion from the second portion, and the closer the third portion is to the second portion in the first direction, the larger an amount of change of the film thickness of the third portion.

15. The semiconductor storage device according to claim 2, further comprising:

a contact provided above the pillar, the contact electrically connecting the pillar and the bit line, wherein the contact is in contact with an upper end of the second portion in the first direction.

16. The semiconductor storage device according to claim 2, wherein the insulating core has an upper end portion adjacent to the second portion in the second direction, the upper end portion includes a first insulating film and a second insulating film, and the second insulating film is provided between the first insulating film and the second portion in the second direction.

17. The semiconductor storage device according to claim 3, wherein the second gate electrode layers include a first layer and a second layer, the first layer serving as the uppermost second gate electrode layer, the second layer being provided lower than the first layer in position, and the second portion extends to a height at least the same as a lower end of the second layer.

18. The semiconductor storage device according to claim 3, wherein the channel layer contains first and second portions each made of a material having particles, an impurity concentration contained in the second portion is the same as that in the first portion, or a diameter of the particles in the second portion is the same as that in the first portion.

19. The semiconductor storage device according to claim 3, wherein the channel layer includes a third portion, the third portion is provided between the first portion and the second portion in the first direction, the third portion gradually becomes thinner as the third portion approaches the first portion from the second portion, and the closer the third portion is to the second portion in the first direction, the larger an amount of change of the film thickness of the third portion.

20. The semiconductor storage device according to claim 3, further comprising:

a contact provided above the pillar, the contact electrically connecting the pillar and the bit line, wherein the contact is in contact with an upper end of the second portion in the first direction.

\* \* \* \* \*